(12) United States Patent
Hayashi et al.

(10) Patent No.: US 12,707,798 B2
(45) Date of Patent: Aug. 11, 2026

(54) DETECTION DEVICE

(71) Applicant: Magnolia White Corporation, Tokyo (JP)

(72) Inventors: Makoto Hayashi, Tokyo (JP); Hirofumi Kato, Tokyo (JP); Yoshitaka Kojima, Tokyo (JP); Yuta Haga, Tokyo (JP); Ayato Kitamura, Tokyo (JP); Yoshiyuki Terada, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 533 days.

(21) Appl. No.: 18/121,181

(22) Filed: Mar. 14, 2023

(65) Prior Publication Data

US 2023/0301125 A1 Sep. 21, 2023

(30) Foreign Application Priority Data

Mar. 16, 2022 (JP) ................................ 2022-040954

(51) Int. Cl.
*H10K 39/00* (2026.01)
*G06V 10/147* (2022.01)
*G06V 40/13* (2022.01)

(52) U.S. Cl.
CPC ......... *H10K 39/601* (2023.02); *G06V 10/147* (2022.01); *G06V 40/13* (2022.01)

(58) Field of Classification Search
CPC ...... H10K 39/601; H10K 65/00; H10K 30/30; G06V 10/147; G06V 40/13
See application file for complete search history.

(56) References Cited

U.S. PATENT DOCUMENTS 11,397,484 B2 * 7/2022 Sun ........................ G06F 3/0412
11,604,543 B2 * 3/2023 Tada ..................... G06F 3/0421
11,645,825 B2 * 5/2023 Tada .................... G06V 10/141
345/156
11,687,196 B2 * 6/2023 Kato .................. G06V 40/1306
345/204
11,854,299 B2 * 12/2023 Kato .................... A61B 5/1171
11,888,080 B2 * 1/2024 Kato ..................... H10F 39/811
11,915,096 B2 * 2/2024 Kato .................. G06V 40/1318
12,026,970 B2 * 7/2024 Himoto ................. G06F 3/0421
12,035,476 B2 * 7/2024 Kato ...................... H05K 1/189
12,045,421 B2 * 7/2024 Kato ...................... G06V 40/13
12,165,430 B2 * 12/2024 Kato .................... G06V 40/145
12,178,059 B2 * 12/2024 Nakamura ......... H10D 30/6733
12,237,346 B2 * 2/2025 Saito .................... A61B 5/1172
12,300,019 B2 * 5/2025 Kato .................. G06V 40/1318
12,302,683 B2 * 5/2025 Himoto .................. H10K 39/38
(Continued)

FOREIGN PATENT DOCUMENTS

JP 2009032005 A 2/2009

*Primary Examiner* — Bitew A Dinke
(74) *Attorney, Agent, or Firm* — K&L Gates LLP

(57) ABSTRACT

According to an aspect, a detection device includes: a light source configured to emit light to an object to be detected; a plurality of photodiodes arranged in a detection area; one or more detection circuits; and a coupling switching circuit configured to switch coupling of one or more of the photodiodes to one or more of the detection circuits. The coupling switching circuit is configured to change the number of the detection circuits coupled to one or more of the photodiodes based on an output value from one or more of the photodiodes.

7 Claims, 16 Drawing Sheets

(56) References Cited

U.S. PATENT DOCUMENTS

| | | | | |
|---|---|---|---|---|
| 12,310,162 | B2 * | 5/2025 | Koide | H10K 30/40 |
| 12,313,460 | B2 * | 5/2025 | Saito | G01J 1/44 |
| 12,364,091 | B2 * | 7/2025 | Tada | H04N 25/79 |
| 2006/0244693 | A1 * | 11/2006 | Yamaguchi | G02F 1/13338<br>345/76 |
| 2009/0027358 | A1 * | 1/2009 | Hosono | G06F 3/0421<br>345/175 |
| 2009/0033638 | A1 * | 2/2009 | Yamaguchi | H10K 59/60<br>345/176 |
| 2010/0282953 | A1 * | 11/2010 | Tam | G01J 1/4204<br>356/402 |
| 2017/0372110 | A1 * | 12/2017 | Uehara | G06F 21/32 |
| 2021/0232287 | A1 * | 7/2021 | Saitoh | G06F 3/0412 |
| 2021/0313384 | A1 * | 10/2021 | Tada | H10F 39/198 |
| 2021/0326623 | A1 * | 10/2021 | Kato | H10F 55/00 |
| 2021/0382973 | A1 * | 12/2021 | Tada | G06T 1/00 |
| 2021/0383094 | A1 * | 12/2021 | Tada | G06V 40/1365 |
| 2021/0384453 | A1 * | 12/2021 | Kawata | G06V 40/1318 |
| 2022/0036036 | A1 * | 2/2022 | Kato | G06T 1/00 |
| 2022/0037410 | A1 * | 2/2022 | Nakamura | H10D 30/6733 |
| 2023/0028839 | A1 * | 1/2023 | Koide | H10K 30/81 |
| 2023/0054533 | A1 * | 2/2023 | Himoto | H10K 39/38 |
| 2023/0055390 | A1 * | 2/2023 | Himoto | G06V 40/1318 |
| 2023/0134613 | A1 * | 5/2023 | Tsunashima | G06V 40/1318<br>257/59 |
| 2023/0369355 | A1 * | 11/2023 | Saito | H10F 39/12 |
| 2024/0324259 | A1 * | 9/2024 | Tada | H10K 39/32 |
| 2024/0381676 | A1 * | 11/2024 | Koide | H10F 77/20 |
| 2025/0008759 | A1 * | 1/2025 | Hayashi | A61B 5/14552 |
| 2025/0063882 | A1 * | 2/2025 | Koide | G06V 40/14 |
| 2025/0113116 | A1 * | 4/2025 | Koide | A61B 5/02 |

* cited by examiner

COM
RST2
GCL (m)
TrR
PAA
PD1
PD2
PD3
PD4
Tr
Ca
VDDSNS
TrS1
TrS2
TrS3
TrS4
16 (19)
SGL1
SGL2
SGL3
SGL4
ASW1
ASW2
ASW3
ASW4
Lout
48
SSW
RSW
Cb
42
Vref
43
ADC
Sout
Dx
Dy
Dz 1
48D DETECTION CIRCUIT
48C DETECTION CIRCUIT
48B DETECTION CIRCUIT
48A DETECTION CIRCUIT
Lout1a
Lout2a
Lout3a
Lout4a
PD1 PD2 PD3 PD4 PD5 PD6 PD7 PD8 PD9 PD10 PD11 PD12 PD13 PD14 PD15 PD16
TrS1 TrS2 TrS3 TrS4 TrS5 TrS6 TrS7 TrS8 TrS9 TrS10 TrS11 TrS12 TrS13 TrS14 TrS15 TrS16
ASW1 ASW2 ASW3 ASW4
Lout1 Lout2 Lout3 Lout4
TrG1 TrG2 TrG3 TrG4 TrG5 TrG6 TrG7 TrG8
GSW1 GSW2 GSW3 GSW4
TrG9 TrG10 TrG11 TrG12 TrG13 TrG14 TrG15 TrG16 TrG17
16
18
19

PD (PD1)
48 (48A)
ST13, ST16
Vdet
Vdet-b
Vdet-a
BASELINE
Sb
Sa
DETECTABLE RANGE (GAIN)
PD (PD1+PD2)
ST18, ST19
Vdet
Vdet-b
Vdet-a
BASELINE
48 (48A)
48 (48B)
Sb
Sa
DETECTABLE RANGE (GAIN)

1A
L1
48A
48B
48C
48D
ADC
43
Cb1
Cb2
Cb3
Cb4
RSW1
RSW2
RSW3
RSW4
42
Verf
SSW1 (18A)
SSW2 (18A)
SSW3 (18A)
SSW4 (18A)
COM
RST2
GCL (m)
TrR
PAA
PD
VDDSNS
Ca
Tr
ASW1
TrS1
SGL
Lout

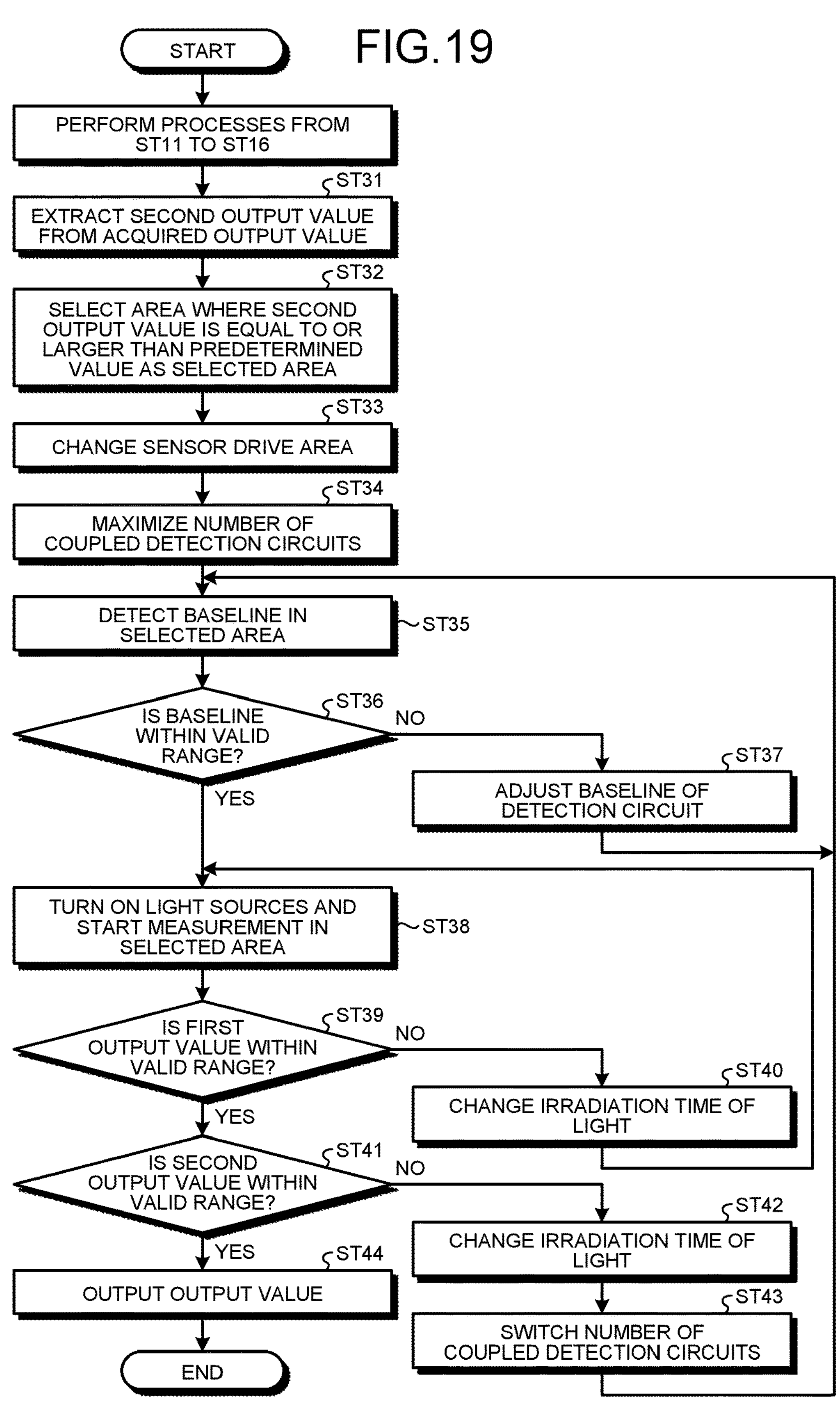
FIG.19
START
PERFORM PROCESSES FROM ST11 TO ST16
ST31
EXTRACT SECOND OUTPUT VALUE FROM ACQUIRED OUTPUT VALUE
ST32
SELECT AREA WHERE SECOND OUTPUT VALUE IS EQUAL TO OR LARGER THAN PREDETERMINED VALUE AS SELECTED AREA
ST33
CHANGE SENSOR DRIVE AREA
ST34
MAXIMIZE NUMBER OF COUPLED DETECTION CIRCUITS
DETECT BASELINE IN SELECTED AREA
ST35
ST36
IS BASELINE WITHIN VALID RANGE?
NO
ST37
ADJUST BASELINE OF DETECTION CIRCUIT
YES
TURN ON LIGHT SOURCES AND START MEASUREMENT IN SELECTED AREA
ST38
ST39
IS FIRST OUTPUT VALUE WITHIN VALID RANGE?
NO
ST40
CHANGE IRRADIATION TIME OF LIGHT
YES
ST41
IS SECOND OUTPUT VALUE WITHIN VALID RANGE?
NO
ST42
CHANGE IRRADIATION TIME OF LIGHT
YES
ST44
OUTPUT OUTPUT VALUE
ST43
SWITCH NUMBER OF COUPLED DETECTION CIRCUITS
END

DETECTION DEVICE

CROSS-REFERENCE TO RELATED APPLICATION

This application claims the benefit of priority from Japanese Patent Application No. 2022-040954 filed on Mar. 16, 2022, the entire contents of which are incorporated herein by reference.

BACKGROUND

1. Technical Field

What is disclosed herein relates to a detection device.

2. Description of the Related Art

Optical sensors capable of detecting fingerprint patterns and vascular patterns are known (for example, Japanese Patent Application Laid-open Publication No. 2009-032005). Among such optical sensors, sensors are known each including a plurality of photodiodes each including an organic semiconductor material used as an active layer.

In the case of such optical sensors, the sensor sensitivity of the photodiodes and the sensitivity of a detection circuit on the system side are required to be appropriately adjusted according to various detection conditions including, for example, the type of each of various types of biometric information to be detected and the condition of an object to be detected.

For the foregoing reasons, there is a need for a detection device in which the detection sensitivity is appropriately adjustable.

SUMMARY

According to an aspect, a detection device includes: a light source configured to emit light to an object to be detected; a plurality of photodiodes arranged in a detection area; one or more detection circuits; and a coupling switching circuit configured to switch coupling of one or more of the photodiodes to one or more of the detection circuits. The coupling switching circuit is configured to change the number of the detection circuits coupled to one or more of the photodiodes based on an output value from one or more of the photodiodes.

BRIEF DESCRIPTION OF THE DRAWINGS

FIG. 19 is a flowchart for explaining a detection method of the detection device according to the third embodiment.

DETAILED DESCRIPTION

Figure 1:
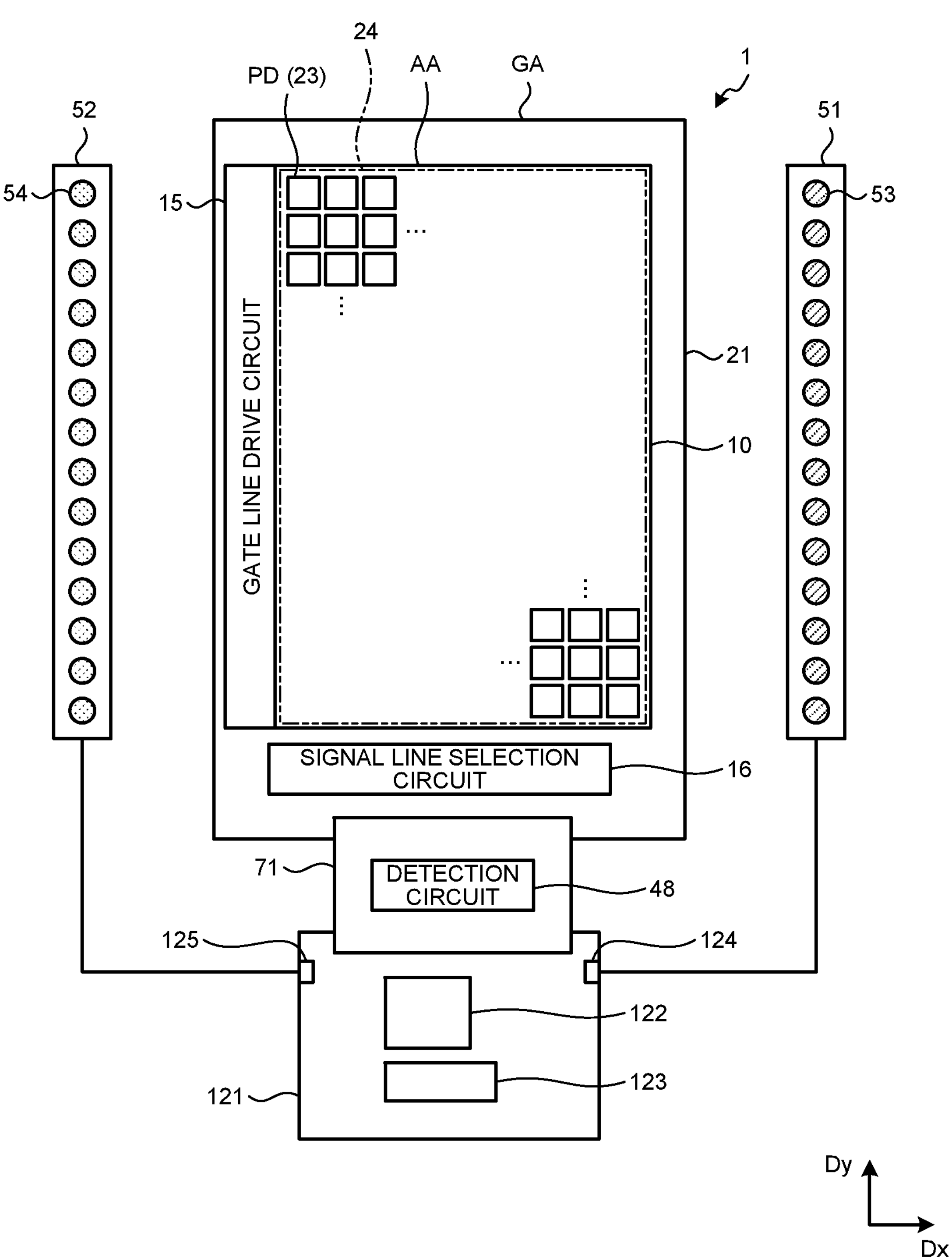
FIG. 1 is a plan view illustrating a detection device according to a first embodiment.

The following describes modes (embodiments) for carrying out the present invention in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the present disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the present disclosure and the drawings, and detailed description thereof may not be repeated where appropriate.

In the present specification and claims, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

First Embodiment

FIG. 1 is a plan view illustrating a detection device according to a first embodiment. As illustrated in FIG. 1, a detection device 1 includes a substrate 21, a sensor 10, a gate line drive circuit 15, a signal line selection circuit 16, a detection circuit 48, a control circuit 122, a power supply circuit 123, a first light source base member 51, a second light source base member 52, and light sources 53 and 54. The first light source base member 51 is provided with a plurality of the light sources 53. The second light source base member 52 is provided with a plurality of the light sources 54.

The substrate 21 is electrically coupled to a control substrate 121 through a wiring substrate 71. The wiring substrate 71 is, for example, a flexible printed circuit board or a rigid circuit board. The wiring substrate 71 is provided with the detection circuit 48. The control substrate 121 is provided with the control circuit 122 and the power supply circuit 123. The control circuit 122 is, for example, a field-programmable gate array (FPGA). The control circuit 122 supplies control signals to the sensor 10, the gate line drive circuit 15, and the signal line selection circuit 16 to control a detection operation of the sensor 10. The control circuit 122 supplies control signals to the light sources 53 and 54 to control lighting and non-lighting of the light sources 53 and 54. The power supply circuit 123 supplies voltage signals including, for example, a sensor power supply signal (sensor power supply voltage) VDDSNS (refer to FIG. 4) to the sensor 10, the gate line drive circuit 15, and the signal line selection circuit 16. The power supply circuit 123 supplies a power supply voltage to the light sources 53 and 54.

The substrate 21 has a detection area AA and a peripheral area GA. The detection area AA is an area provided with a plurality of photodiodes PD included in the sensor 10. The peripheral area GA is an area between the outer perimeter of the detection area AA and the ends of the substrate 21 and is an area not provided with the photodiodes PD.

The sensor 10 includes the photodiodes PD as optical sensor elements. Each of the photodiodes PD outputs an electrical signal corresponding to light emitted thereto. More specifically, the photodiode PD is an organic photodiode (OPD) using an organic semiconductor. The photodiodes PD are arranged in a matrix having a row-column configuration in the detection area AA. The photodiode PD includes a lower electrode 23 disposed below the organic semiconductor and an upper electrode 24 disposed above the organic semiconductor. A plurality of the lower electrodes 23 are provided one for each of the photodiodes and are arranged in a matrix having a row-column configuration in the detection area AA. The upper electrode 24 is provided across the photodiodes PD and provided continuously in the detection area AA. The configuration of the photodiodes PD, the lower electrodes 23, and the upper electrode 24 will be described later with reference to FIG. 5.

Each of the photodiodes PD performs the detection according to a gate drive signal VGL supplied from the gate line drive circuit 15. The photodiode PD outputs the electrical signal corresponding to the light emitted thereto as a detection signal Vdet to the signal line selection circuit 16. The detection device 1 detects information on an object to be detected based on the detection signals Vdet received from the photodiodes PD.

The gate line drive circuit 15 and the signal line selection circuit 16 are provided in the peripheral area GA. Specifically, the gate line drive circuit 15 is provided in an area extending along a second direction Dy in the peripheral area GA. The signal line selection circuit 16 is provided in an area extending along a first direction Dx in the peripheral area GA, and is provided between the sensor 10 and the detection circuit 48.

In the following description, the first direction Dx is one direction in a plane parallel to the substrate 21. The second direction Dy is one direction in the plane parallel to the substrate 21 and is a direction orthogonal to the first direction Dx. The second direction Dy may non-orthogonally intersect the first direction Dx. A third direction Dz is a direction orthogonal to the first direction Dx and the second direction Dy. The third direction Dz is a direction normal to the substrate 21. The term "plan view" refers to a positional relation when viewed from a direction orthogonal to the substrate 21.

The light sources 53 are provided on the first light source base member 51, and arranged along the second direction Dy. The light sources 54 are provided on the second light source base member 52, and arranged along the second direction Dy. The first light source base member 51 and the second light source base member 52 are electrically coupled, through respective terminals 124 and 125 provided on the control substrate 121, to the control circuit 122 and the power supply circuit 123.

For example, inorganic light-emitting diodes (LEDs) or organic electroluminescent (EL) diodes (organic light-emitting diodes (OLEDs)) are used as the light sources 53 and 54. The light sources 53 and 54 emit light having different wavelengths from each other.

First light emitted from the light sources 53 is mainly reflected, for example, on a surface of the object to be detected, such as a finger, and is incident on the sensor 10. As a result, the sensor 10 can detect a fingerprint by detecting a shape of asperities on the surface of the finger or the like. Second light emitted from the light sources 54 is mainly reflected in the finger or the like, or transmitted through the finger or the like, and is incident on the sensor 10. As a result, the sensor 10 can detect information on a living body in the finger or the like. Examples of the information on the living body include pulse waves, pulsation, and a vascular image of the finger or a palm. That is, the detection device 1 may be configured as a fingerprint detection device to detect a fingerprint or a vein detection device to detect a vascular pattern of, for example, veins.

The arrangement of the light sources 53 and 54 illustrated in FIG. 1 is merely an example, and can be changed as appropriate. The detection device 1 is provided with a plurality of types of the light sources 53 and 54 as light sources. However, the light sources are not limited thereto, and may be of one type. For example, the light sources 53 and 54 may be arranged on each of the first light source base member 51 and the second light source base members 52. The light sources 53 and 54 may be provided on one light source base member, or three or more light source base members. Alternatively, only at least one light source needs to be disposed.

Figure 2:
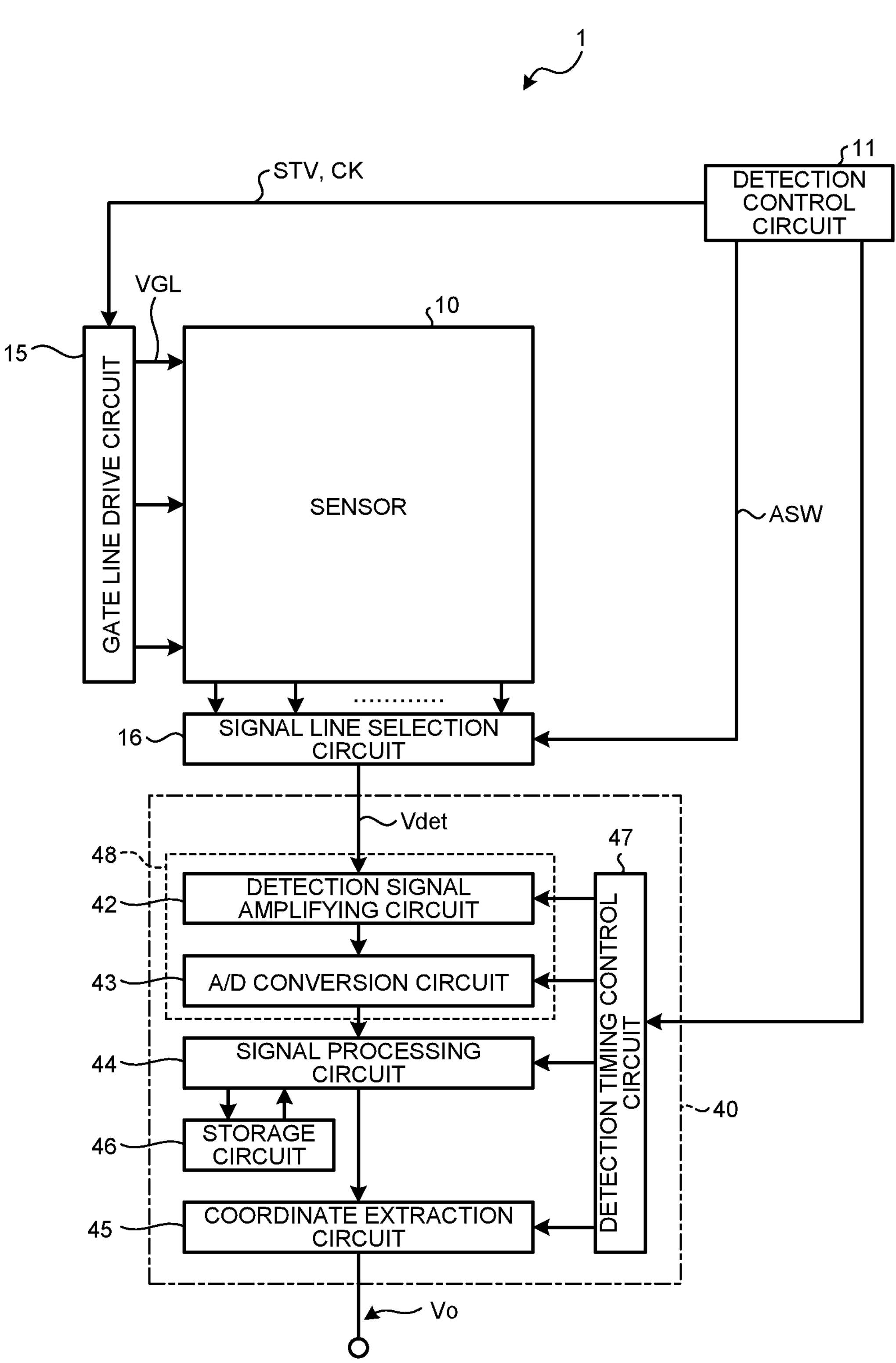
FIG. 2 is a block diagram illustrating a configuration example of the detection device according to the first embodiment.

FIG. 2 is a block diagram illustrating a configuration example of the detection device according to the first embodiment. As illustrated in FIG. 2, the detection device 1 further includes a detection control circuit 11 and a detector (detection signal processing circuit) 40. The control circuit 122 includes one, some, or all functions of the detection control circuit 11. The control circuit 122 also includes one, some, or all functions of the detector 40 other than those of the detection circuit 48.

The detection control circuit 11 is a circuit that supplies respective control signals to the gate line drive circuit 15, the signal line selection circuit 16, and the detector 40 to control operations thereof. The detection control circuit 11 supplies various control signals including, for example, a start signal STV and a clock signal CK to the gate line drive circuit 15.

The detection control circuit 11 also supplies various control signals including, for example, a selection signal ASW to the signal line selection circuit 16. The detection control circuit 11 also supplies various control signals to the light sources 53 and 54 to control the lighting and non-lighting of the respective light sources 53 and 54.

The gate line drive circuit 15 is a circuit that drives a plurality of gate lines GCL (refer to FIG. 3) based on the various control signals. The gate line drive circuit 15 sequentially or simultaneously selects the gate lines GCL, and supplies the gate drive signals VGL to the selected gate lines GCL. By this operation, the gate line drive circuit 15 selects the photodiode PD coupled to the gate lines GCL.

Figure 3:
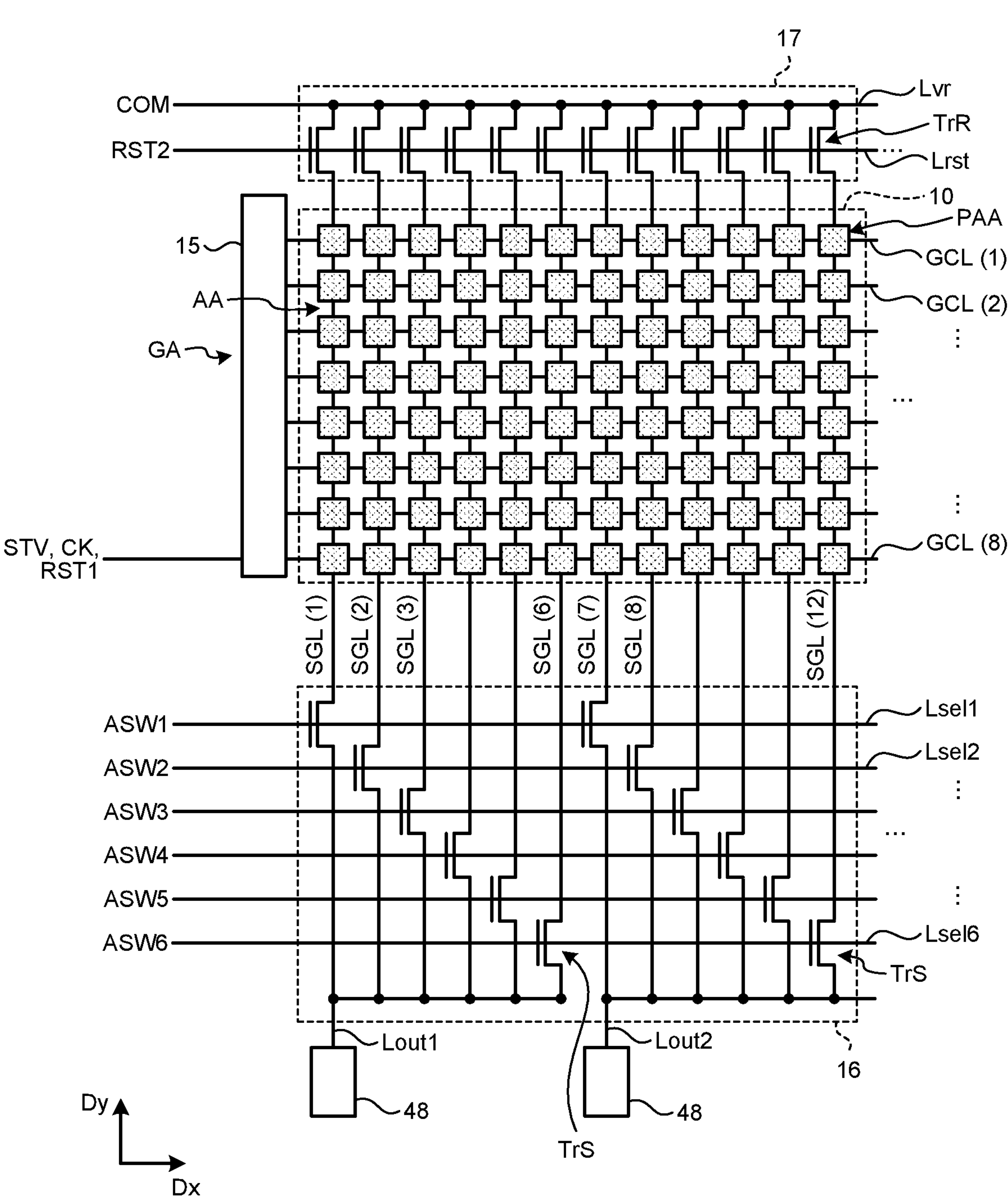
FIG. 3 is a circuit diagram illustrating the detection device.

The signal line selection circuit 16 is a switch circuit that sequentially or simultaneously selects a plurality of signal lines SGL (refer to FIG. 3). The signal line selection circuit 16 is, for example, a multiplexer. The signal line selection circuit 16 couples the selected signal lines SGL to the detection circuit 48 based on the selection signal ASW supplied from the detection control circuit 11. By this operation, the signal line selection circuit 16 outputs the detection signal Vdet of the photodiode PD to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 amplifies the detection signal Vdet. The A/D conversion circuit 43 converts an analog signal output from the detection signal amplifying circuit 42 into a digital signal.

The signal processing circuit 44 is a logic circuit that detects a predetermined physical quantity received by the sensor 10 based on output signals of the detection circuit 48. The signal processing circuit 44 can detect the asperities on the surface of the finger or the palm based on the signals from the detection circuit 48 when the finger is in contact with or in proximity to a detection surface. The signal processing circuit 44 can detect the information on the living body based on the signals from the detection circuit 48. Examples of the information on the living body include the vascular image, the pulse waves, the pulsation, and a blood oxygen level of the finger or the palm.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger or the like when the contact or proximity of the finger is detected by the signal processing circuit 44. The coordinate extraction circuit 45 is the logic circuit that also obtains detected coordinates of blood vessels in the finger or the palm. The coordinate extraction circuit 45 combines the detection signals Vdet output from the photodiodes PD of the sensor 10 to generate two-dimensional information indicating the shape of the asperities on the surface of the finger or the like and two-dimensional information indicating the shape of the blood vessels in the finger or the palm. The coordinate extraction circuit 45 may output an output value Sout (refer to FIGS. 8 and 9) from the detection circuit 48 as a sensor output voltage Vo, instead of calculating the detected coordinates.

The following describes a circuit configuration example of the detection device 1. FIG. 3 is a circuit diagram illustrating the detection device. As illustrated in FIG. 3, the sensor 10 has a plurality of partial detection areas PAA arranged in a matrix having a row-column configuration. Each of the partial detection areas PAA is provided with the photodiode PD.

The gate lines GCL extend in the first direction Dx, and are each coupled to the partial detection areas PAA arranged in the first direction Dx. A plurality of gate lines GCL(1), GCL(2), . . . , GCL(8) are arranged in the second direction Dy, and are each coupled to the gate line drive circuit 15. In the following description, the gate lines GCL(1), GCL(2), . . . , GCL(8) will each be simply referred to as the gate line GCL when they need not be distinguished from one another. For ease of understanding of the description, FIG. 3 illustrates eight gate lines GCL. However, this is merely an example, and M gate lines GCL (where M is 8 or larger, and is, for example, 256) may be arranged.

The signal lines SGL extend in the second direction Dy, and are each coupled to the photodiodes PD in the partial detection areas PAA arranged in the second direction Dy. A plurality of signal lines SGL(1), SGL(2), . . . , SGL(12) are arranged in the first direction Dx, and are each coupled to the signal line selection circuit 16 and a reset circuit 17. In the following description, the signal lines SGL(1), SGL(2), . . . , SGL(12) will each be simply referred to as the signal line SGL when they need not be distinguished from one another.

For ease of understanding of the description, 12 signal lines SGL are illustrated. However, this is merely an example, and N signal lines SGL (where N is 12 or larger, and is, for example, 252) may be arranged. The resolution of the sensor is, for example, 508 dots per inch (dpi), and the number of cells is 252×256. In FIG. 3, the sensor 10 is provided between the signal line selection circuit 16 and the reset circuit 17. The present disclosure is not limited thereto. The signal line selection circuit 16 and the reset circuit 17 may be coupled to ends of the signal lines SGL in the same direction.

The gate line drive circuit 15 receives various control signals including, for example, the start signal STV, the clock signal CK, and a reset signal RST1 from the control circuit 122 (refer to FIG. 1). The gate line drive circuit 15 sequentially selects the gate lines GCL(1), GCL(2), . . . , GCL(8) in a time-division manner based on the various control signals. The gate line drive circuit 15 supplies the gate drive signal VGL to the selected one of the gate lines GCL. Through this operation, the gate drive signal VGL is supplied to a plurality of drive transistors Tr coupled to the gate line GCL and corresponding ones of the partial detection areas PAA arranged in the first direction Dx are selected as detection targets.

The signal line selection circuit 16 includes a plurality of selection signal lines Lsel, a plurality of output signal lines Lout, and a plurality of output transistors TrS. The output transistors TrS are provided corresponding to the signal lines SGL. Each of the output transistors TrS is a switch that switches a coupling between one of the output signal lines Lout and one of the signal lines SGL. Six signal lines SGL(1), SGL(2), . . . , SGL(6) are coupled to a common output signal line Lout1. Six signal lines SGL(7), SGL(8), . . . , SGL(12) are coupled to a common output signal line Lout2. The output signal lines Lout1 and Lout2 are each coupled to the detection circuit 48.

The signal lines SGL(1), SGL(2), . . . , SGL(6) are grouped into a first signal line block, and the signal lines SGL(7), SGL(8), . . . , SGL(12) are grouped into a second signal line block. The selection signal lines Lsel are coupled to the gates of the respective output transistors TrS included in one of the signal line blocks. One of the selection signal lines Lsel is coupled to the gates of the output transistors TrS in the signal line blocks.

The control circuit 122 (refer to FIG. 1) sequentially supplies the selection signal ASW to the selection signal lines Lsel. This operation causes the signal line selection circuit 16 to operate the output transistors TrS to sequentially select the signal lines SGL in one of the signal line blocks in a time-division manner. The signal line selection circuit 16 selects one of the signal lines SGL in each of the signal line blocks. With the above-described configuration, the detection device 1 can reduce the number of integrated circuits (ICs) including the detection circuit 48 or the number of terminals of the ICs. The signal line selection circuit 16 may couple more than one of the signal lines SGL collectively to the detection circuit 48. FIG. 3 does not illustrate a detection circuit selecting circuit 18 (refer to FIG. 12) provided between the signal line selection circuit 16 and a plurality of the detection circuits 48. A coupling configuration of the signal lines SGL to the detection circuits 48 will be described in detail with reference to FIG. 12 and the subsequent drawings.

As illustrated in FIG. 3, the reset circuit 17 includes a reference signal line Lvr, a reset signal line Lrst, and reset transistors TrR. The reset transistors TrR are provided correspondingly to the signal lines SGL. The reference signal line Lvr is coupled to either the sources or the drains of the reset transistors TrR. The reset signal line Lrst is coupled to the gates of the reset transistors TrR.

The control circuit 122 supplies a reset signal RST2 to the reset signal line Lrst. This operation turns on the reset transistors TrR to electrically couple the signal lines SGL to the reference signal line Lvr. The power supply circuit 123 supplies a reference signal COM to the reference signal line Lvr. This operation supplies the reference signal COM to a capacitive element Ca (refer to FIG. 4) included in each of the partial detection areas PAA.

Figure 4:
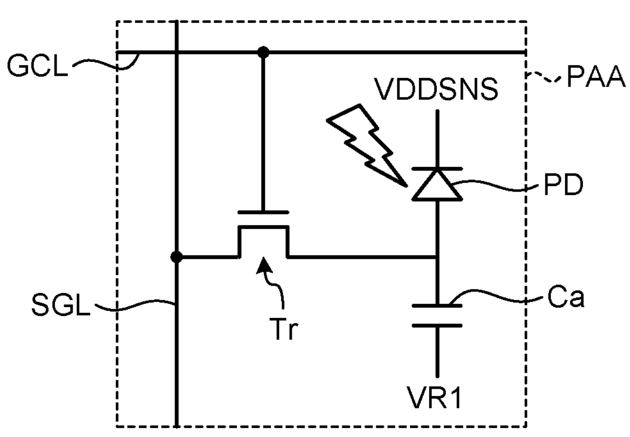
FIG. 4 is a circuit diagram illustrating a partial detection area of the detection device.

FIG. 4 is a circuit diagram illustrating the partial detection area of the detection device. As illustrated in FIG. 4, the partial detection area PAA includes the photodiode PD, the capacitive element Ca, and a corresponding one of the drive transistors Tr. The capacitive element Ca is a capacitor (sensor capacitance) generated in the photodiode PD and is equivalently coupled to the anode of the photodiode PD.

The drive transistors Tr are provided corresponding to the photodiodes PD. Each of the drive transistors Tr is formed of a thin-film transistor, and in this example, formed of an n-channel metal oxide semiconductor (MOS) thin-film transistor (TFT).

The gate of the drive transistor Tr is coupled to the gate line GCL. The source of the drive transistor Tr is coupled to the signal line SGL. The drain of drive transistor Tr is coupled to the anode of photodiode PD and the capacitive element Ca.

The cathode of the photodiode PD is supplied with the sensor power supply signal VDDSNS from the power supply circuit 123. The signal line SGL and the capacitive element Ca are supplied with a reference signal VR1 that serves as an initial potential of the signal line SGL and the capacitive element Ca from the power supply circuit 123.

When the partial detection area PAA is irradiated with light in an exposure period Pex (refer to FIG. 6), a current corresponding to the amount of the light flows through the photodiode PD. As a result, an electric charge is stored in the capacitive element Ca. After the drive transistor Tr is turned on in a read period Pdet (refer to FIG. 6), a current corresponding to the electric charge stored in the capacitive element Ca flows through the signal line SGL. The signal line SGL is coupled to the detection circuit 48 through the output transistor TrS of the signal line selection circuit 16. Thus, the detection device 1 can detect a signal corresponding to the amount of the light received by the photodiode PD in each of the partial detection areas PAA.

Figure 5:
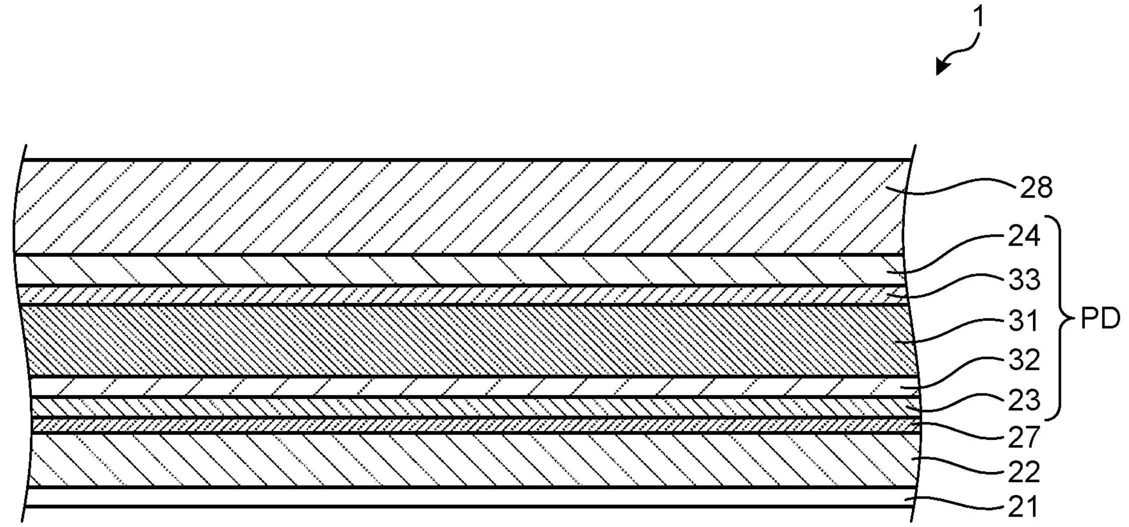
FIG. 5 is a sectional view illustrating a schematic sectional configuration of the detection device according to the first embodiment.

The following describes a configuration example of the photodiode PD. FIG. 5 is a sectional view illustrating a schematic sectional configuration of the detection device according to the first embodiment. FIG. 5 does not illustrate various transistors and various types of wiring (for example, the gate line GCL and the signal line SGL) formed on the substrate 21.

A direction from the substrate 21 toward a sealing film 28 in a direction orthogonal to a surface of the substrate 21 is referred to as “upper side” or simply “above”. A direction from the sealing film 28 toward the substrate 21 is referred to as “lower side” or simply “below”.

The substrate 21 is an insulating substrate and is made using, for example, glass or a resin material. The substrate 21 is not limited to having a flat plate shape but may have a curved surface. In this case, the substrate 21 may be a film-like resin substrate. A TFT layer 22, an insulating film 27, the photodiode PD, and the sealing film 28 are stacked in this order on the substrate 21.

The TFT layer 22 is provided with circuits such as the gate line drive circuit 15 and the signal line selection circuit 16 described above. The TFT layer 22 is also provided with TFTs such as the drive transistor Tr, and the various types of wiring such as the gate line GCL and the signal line SGL. The substrate 21 and the TFT layer 22 serve as a drive circuit board for driving the sensor for each predetermined detection area and are also called a backplane or an array substrate.

The insulating film 27 is provided so as to cover the drive transistor Tr and the various types of wiring in the TFT layer 22. The insulating film 27 may be an inorganic insulating film or an organic insulating film. The insulating film 27 is not limited to a single layer, but may be a multilayered film obtained by stacking a plurality of insulating films.

The photodiode PD is provided on the insulating film 27. In more detail, the photodiode PD includes the lower electrode 23, a lower buffer layer 32, an active layer 31, an upper buffer layer 33, and the upper electrode 24. In the photodiode PD, the lower electrode 23, the lower buffer layer 32 (hole transport layer), the active layer 31, the upper buffer layer 33 (electron transport layer), and the upper electrode 24 are stacked in this order in the direction orthogonal to the substrate 21.

The lower electrode 23 is an anode electrode of the photodiode PD and is formed of, for example, a light-transmitting conductive material such as indium tin oxide (ITO). The detection device 1 of the present embodiment is a bottom-surface light receiving optical sensor in which the light from the object to be detected passes through the substrate 21 and enters the photodiode PD.

The active layer 31 changes in characteristics (for example, voltage-current characteristics and resistance value) according to light emitted thereto. An organic material is used as a material of the active layer 31. Specifically, the active layer 31 has a bulk heterostructure containing a mixture of a p-type organic semiconductor and an n-type fullerene derivative (PCBM) that is an n-type organic semiconductor. As the active layer 31, low-molecular-weight organic materials can be used including, for example, fullerene ($C_{60}$), phenyl-$C_{61}$-butyric acid methyl ester (PCBM), copper phthalocyanine (CuPc), fluorinated copper phthalocyanine ($F_{16}CuPc$), 5,6,11,12-tetraphenyltetracene (rubrene), and perylene diimide (PDI) (derivative of perylene).

The active layer 31 can be formed by a vapor deposition process (dry process) using any of these low-molecular-weight organic materials. In this case, the active layer 31 may be, for example, a multilayered film of CuPc and $F_{16}CuPc$, or a multilayered film of rubrene and $C_{60}$. The active layer 31 can also be formed by a coating process (wet process). In this case, the active layer 31 is made using a material obtained by combining any of the above-listed low-molecular-weight organic materials with a high-molecular-weight organic material. As the high-molecular-weight organic material, for example, poly(3-hexylthiophene) (P3HT) and F8-alt-benzothiadiazole (F8BT) can be used. The active layer 31 can be a film made of a mixture of P3HT and PCBM, or a film made of a mixture of F8BT and PDI.

The lower buffer layer 32 is a hole transport layer, and the upper buffer layer 33 is an electron transport layer. The lower buffer layer 32 and the upper buffer layer 33 are provided to facilitate holes and electrons generated in the active layer 31 to reach the lower electrode 23 or the upper electrode 24. The lower buffer layer 32 (hole transport layer) is in direct contact with the top of the lower electrode 23. The active layer 31 is in direct contact with the top of the lower buffer layer 32. The material of the hole transport layer is an oxide metal layer. For example, tungsten oxide ($WO_3$) or molybdenum oxide is used as the oxide metal layer.

The upper buffer layer 33 (electron transport layer) is in direct contact with the top of the active layer 31, and the upper electrode 24 is in direct contact with the top of the upper buffer layer 33. Polyethylenimine ethoxylated (PEIE) is used as a material of the electron transport layer.

The materials and the manufacturing methods of the lower buffer layer 32, the active layer 31, and the upper buffer layer 33 are merely examples, and other materials and manufacturing methods may be used. For example, each of the lower buffer layer 32 and the upper buffer layer 33 is not limited to a single-layer film but may be formed as a multilayered film that includes an electron block layer and a hole block layer.

The upper electrode 24 is provided on the upper buffer layer 33. The upper electrode 24 is a cathode electrode of the photodiode PD and is continuously formed over the entire detection area AA. In other words, the upper electrode 24 is continuously provided in the upper side layer of the photodiodes PD. The upper electrode 24 faces the lower electrodes 23 with the lower buffer layer 32, the active layer 31, and the upper buffer layer 33 interposed therebetween. A metal material such as silver (Ag) is used as the upper electrode 24. When the upper electrode 24 is formed of a metal material, the upper electrode 24 can be a transflective electrode by controlling the film thickness. In this case, the detection device 1 is formed as a top-surface light receiving sensor in which light enters the photodiode PD from the upper electrode 24 side, or as a double-surface light receiving optical sensor. The upper electrode 24 is not limited to a metal material, but may be made using a light-transmitting conductive material, such as ITO or indium zinc oxide (IZO).

The sealing film 28 is provided on the upper electrode 24. An inorganic insulating film such as a silicon nitride film or an aluminum oxide film or a resin film such as an acrylic film is used as the sealing film 28. The sealing film 28 is not limited to a single layer but may be a multilayered film having two or more layers obtained by combining the inorganic film with the resin film mentioned above. The sealing film 28 well seals the photodiode PD, and thus can restrain water from entering the photodiode PD from the upper surface side thereof.

Figure 6:
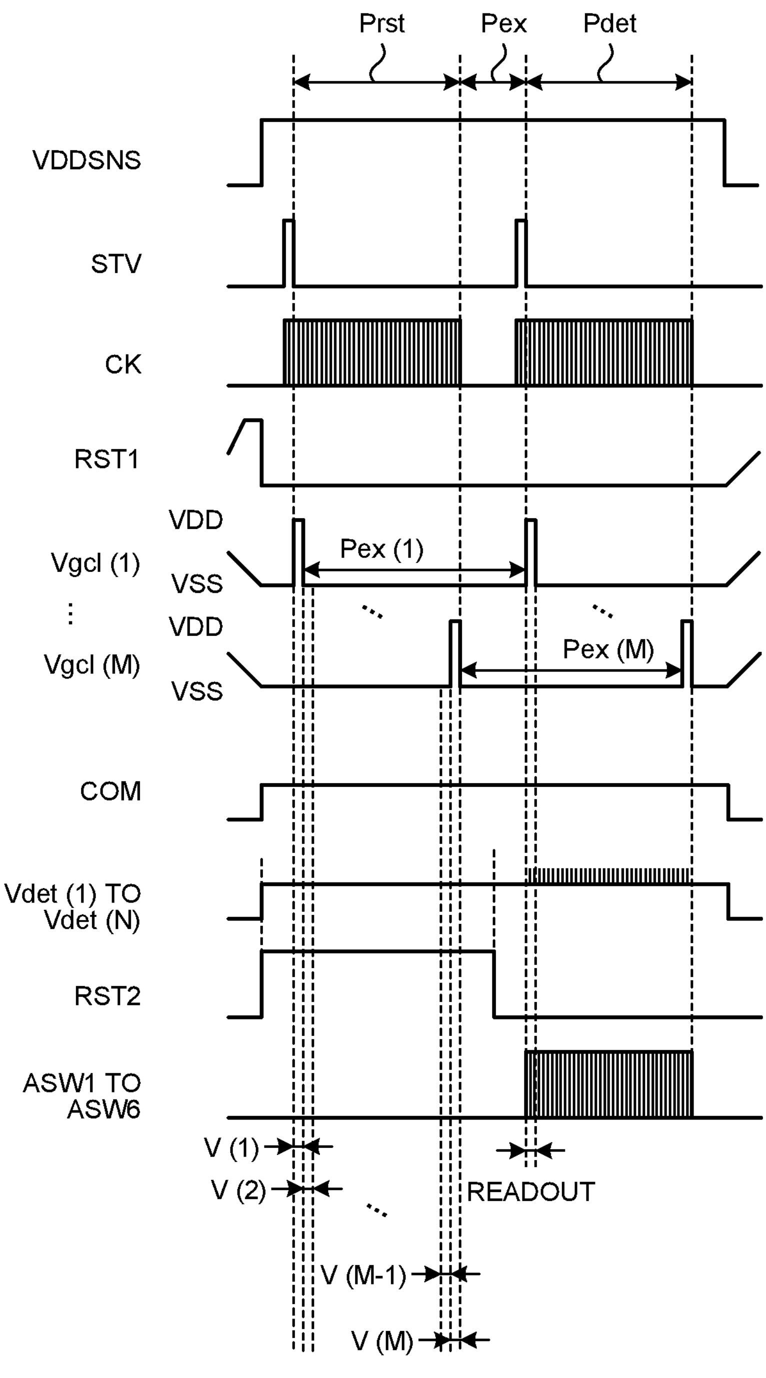
FIG. 6 is a timing waveform diagram illustrating an operation example of the detection device.

The following describes an operation example of the detection device 1. FIG. 6 is a timing waveform diagram illustrating the operation example of the detection device. As illustrated in FIG. 6, the detection device 1 has a reset period Prst, the exposure period Pex, and the read period Pdet. The power supply circuit 123 supplies the sensor power supply signal VDDSNS to the cathode of the photodiode PD over the reset period Prst, the exposure period Pex, and the read period Pdet. The sensor power supply signal VDDSNS is a signal that applies a reverse bias between the anode and the cathode of the photodiode PD. For example, the sensor power supply signal VDDSNS of substantially 2.75 V is applied to the cathode of the photodiode PD, and the reference signal COM of substantially 0.75 V is applied to the anode thereof. As a result, a reverse bias of substantially 2.0 V is applied between the anode and the cathode. The reverse bias voltage may be set in the range of 1.5 V to 2.5 V. The control circuit 122 sets the reset signal RST2 to "H", and then, supplies the start signal STV and the clock signal CK to the gate line drive circuit 15 to start the reset period Prst. During the reset period Prst, the control circuit 122 supplies the reference signal COM to the reset circuit 17 and uses the reset signal RST2 to turn on the reset transistor TrR for supplying a reset voltage. This operation supplies the reference signal COM as the reset voltage to each of the signal lines SGL. The reference signal COM is set to, for example, 0.75 V.

During the reset period Prst, the gate line drive circuit 15 sequentially selects each of the gate lines GCL based on the start signal STV, the clock signal CK, and the reset signal RST1. The gate line drive circuit 15 sequentially supplies gate drive signals Vgcl {Vgcl(1), . . . , Vgcl(M)} to the gate lines GCL. Each of the gate drive signals Vgcl has a pulsed waveform having a power supply voltage VDD serving as a high-level voltage and a power supply voltage VSS serving as a low-level voltage. In FIG. 6, M gate lines GCL (where M is, for example, 256) are provided, and the gate drive signals Vgcl(1), . . . , Vgcl(M) are sequentially supplied to the respective gate lines GCL. Thus, the drive transistors Tr are sequentially brought into a conducting state and supplied with the reset voltage on a row-by-row basis. For example, a voltage of 0.75 V of the reference signal COM is supplied as the reset voltage.

Thus, during the reset period Prst, the capacitive elements Ca of all the partial detection areas PAA are sequentially electrically coupled to the signal lines SGL and are supplied with the reference signal COM. As a result, the capacitance of the capacitive elements Ca is reset. The capacitance of the capacitive elements Ca of some of the partial detection areas PAA can be reset by partially selecting the gate lines and the signal lines SGL.

Examples of the method of controlling the exposure include a method of controlling the exposure during non-selection of the gate lines and a method of always controlling the exposure. In the method of controlling the exposure during non-selection of the gate lines, the gate drive signals {Vgcl(1), . . . , Vgcl(M)} are sequentially supplied to all the gate lines GCL coupled to the photodiodes PD serving as the detection targets, and all the photodiodes PD serving as the detection targets are supplied with the reset voltage. Then, after all the gate lines GCL coupled to the photodiodes PD serving as the detection targets are set to a low voltage (the drive transistors Tr are turned off), the exposure starts and the exposure is performed during the exposure period Pex. After the exposure ends, the gate drive signals {Vgcl(1), . . . , Vgcl(M)} are sequentially supplied to the gate lines GCL coupled to the photodiodes PD serving as the detection targets as described above, and reading is performed during the read period Pdet. In the method of always controlling the exposure, the control for performing the exposure can also be performed during the reset period Prst and the read period Pdet (the exposure is always controlled). In this case, the exposure period Pex(1) actually starts after the gate drive signal Vgcl(1) is supplied to the gate line GCL during the reset period Prst. The actual exposure periods Pex {(1), . . . , (M)} are periods during which the capacitive elements Ca are charged from the photodiodes PD. The electric charges stored in the capacitive elements Ca during the reset period Prst flow as reverse directional currents (from cathodes to anodes) through the photodiodes PD due to light irradiation, and potential differences in the capacitive elements Ca decrease. The start timing and the end timing of the actual exposure periods Pex(1), . . . , Pex(M) are different among the partial detection areas PAA corresponding to the respective gate lines GCL. Each of the exposure periods Pex(1), . . . , Pex(M) actually starts when the gate drive signal Vgcl changes from the power supply voltage VDD serving as the high-level voltage to the power supply voltage VSS serving as the low-level voltage during the reset period Prst. Each of the exposure periods Pex(1), . . . , Pex(M) actually ends when the gate drive signal Vgcl changes from the power supply voltage VSS to the power supply voltage VDD during the read period Pdet. The actual lengths of the exposure time of the exposure periods Pex(1), . . . , Pex(M) are equal.

In the method of controlling the exposure during non-selection of the gate lines, a current corresponding to the light received by the photodiode PD flows in each of the partial detection areas PAA during the exposure periods Pex {(1) . . . (M)}. As a result, an electric charge is stored in each of the capacitive elements Ca.

At a time before the read period Pdet starts, the control circuit 122 sets the reset signal RST2 to a low-level voltage. This operation stops the operation of the reset circuit 17. The reset signal may be set to a high-level voltage only during the reset period Prst. During the read period Pdet, the gate line drive circuit 15 sequentially supplies the gate drive signals Vgcl(1), . . . , Vgcl(M) to the gate lines GCL in the same manner as during the reset period Prst.

Specifically, the gate line drive circuit 15 supplies the gate drive signal Vgcl(1) at the high-level voltage (power supply voltage VDD) to the gate line GCL(1) during a period V(1). The control circuit 122 sequentially supplies the selection signals ASW1, . . . , ASW6 to the signal line selection circuit 16 during a period in which the gate drive signal Vgcl(1) is at the high-level voltage (power supply voltage VDD). This operation sequentially or simultaneously couples the signal lines SGL of the partial detection areas PAA selected by the gate drive signal Vgcl(1) to the detection circuit 48. As a result, the detection signal Vdet for each of the partial detection areas PAA is supplied to the detection circuit 48.

In the same manner, the gate line drive circuit 15 supplies the gate drive signals Vgcl(2), . . . , Vgcl(M−1), Vgcl(M) at the high-level voltage to gate lines GCL(2), . . . , GCL(M−1), GCL(M) during periods V(2), . . . , V(M−1), V(M), respectively. That is, the gate line drive circuit 15 supplies the gate drive signal Vgcl to the gate line GCL during each of the periods V(1), V(2), . . . , V(M−1), V(M). The signal line selection circuit 16 sequentially selects each of the signal lines SGL based on the selection signal ASW in each period in which the gate drive signal Vgcl is set to the high-level voltage. The signal line selection circuit 16 sequentially couples each of the signal lines SGL to one of the detection circuits 48. Thus, the detection device 1 can output the detection signals Vdet of all the partial detection areas PAA to the detection circuit 48 during the read period Pdet.

Figure 7:
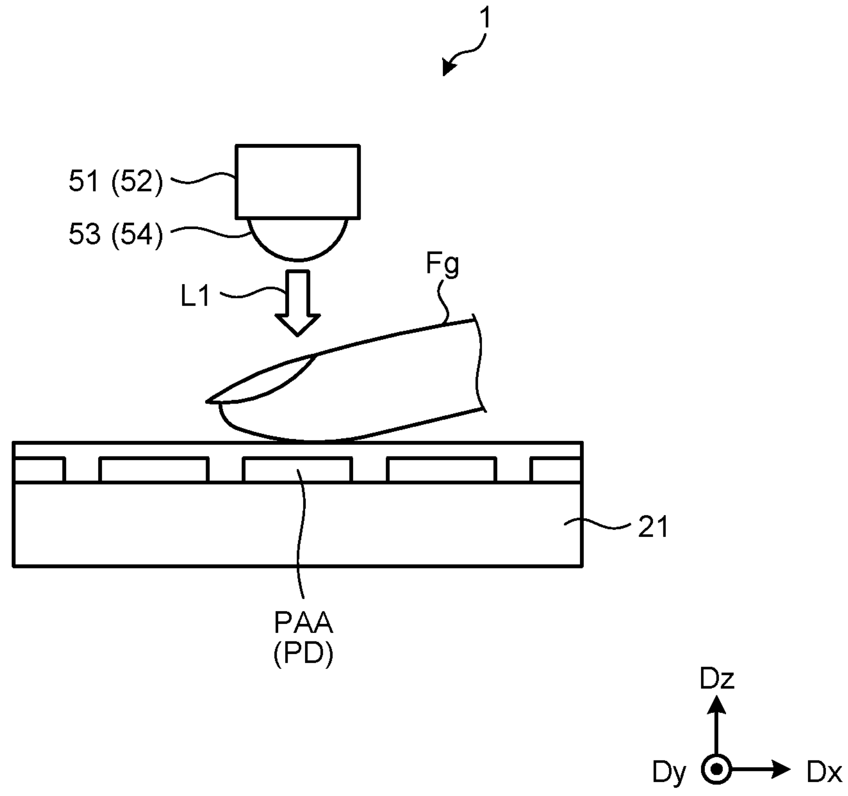
FIG. 7 is an explanatory diagram for explaining an arrangement relation between photodiodes, light sources, and an object to be detected in detection by the detection device.

The following describes an operation example of the detection device 1 during the read period Pdet with reference to FIGS. 7 to 11. FIG. 7 is an explanatory diagram for explaining an arrangement relation between the photodiodes, the light sources, and the object to be detected in the detection by the detection device. As illustrated in FIG. 7, the photodiodes PD are arranged for the respective partial detection areas PAA on the substrate 21. The light sources 53 and 54 are provided above the substrate 21 and the photodiodes PD, with an object Fg to be detected, such as the finger, interposed between the light sources and the photodiodes. Light L1 emitted from the light sources 53 and 54 passes through the object Fg to be detected, and irradiates the photodiodes PD. Using the light L1 emitted from the light sources 53 and 54, the photodiodes PD can detect information on the object Fg to be detected.

Thus, the photodiodes PD detect the amount of the light L1 that has been reflected, scattered, and transmitted in the object Fg to be detected. At this time, a change in state of the object Fg to be detected (for example, contraction of blood vessels) causes a slight change in the light L1 transmitted through the object Fg to be detected. The photodiodes PD detect biometric information (for example, the pulse waves) based on the amount of the change in the light L1 transmitted through the object Fg to be detected. An increase in the amount of the light L1 emitted from light sources 53 and 54 also increases the amount of the light L1 transmitted through the object Fg to be detected, and increases the current (electric charge amount) obtained from the photodiodes PD.

As illustrated in FIG. 7, the detection device 1 is a transmissive detection device that detects the light L1 transmitted through the object Fg to be detected. However, the detection device 1 is not limited thereto, but may be a reflective detection device.

Figure 8:
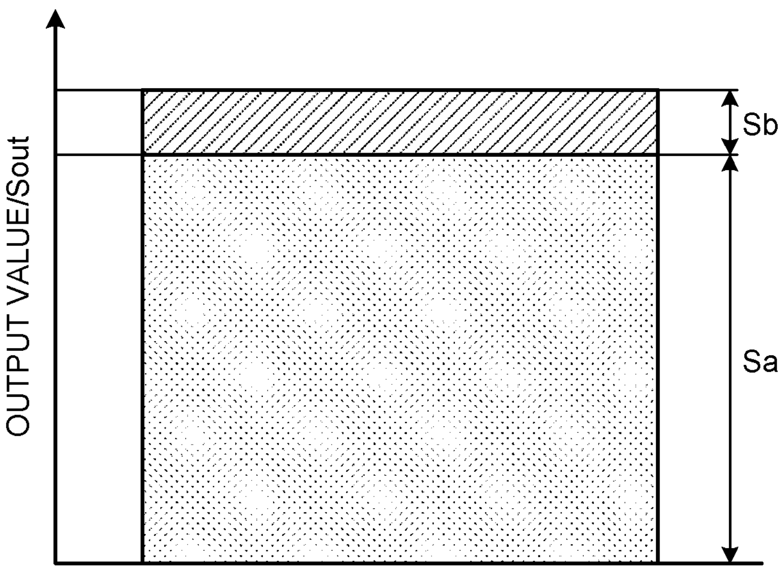
FIG. 8 is an explanatory diagram for explaining an output value from the photodiodes.

FIG. 8 is an explanatory diagram for explaining the output value from the photodiodes. The output value Sout illustrated in FIG. 8 is a voltage signal output after being subjected to signal processing by the detection circuit 48 (refer to FIG. 9) based on the detection signal Vdet output from one or more of the photodiodes PD. As illustrated in FIG. 8, the output value Sout includes a first output value Sa and a second output value Sb. The first output value Sa is a detection value mainly corresponding to the amount of the light L1 emitted from the light sources 53 and 54 and is output as a constant value (direct-current (DC) component) regardless of the change in the state of the object Fg to be detected. The second output value Sb is a detection value (alternating-current (AC) component) that indicates the amount of the change in the light L1 transmitted through the object Fg to be detected caused by the change in the state of the object Fg to be detected (for example, the contraction of the blood vessels). The detection device 1 can improve the detection sensitivity to the biometric information by accurately detecting the second output value Sb of the output value Sout.

Figure 9:
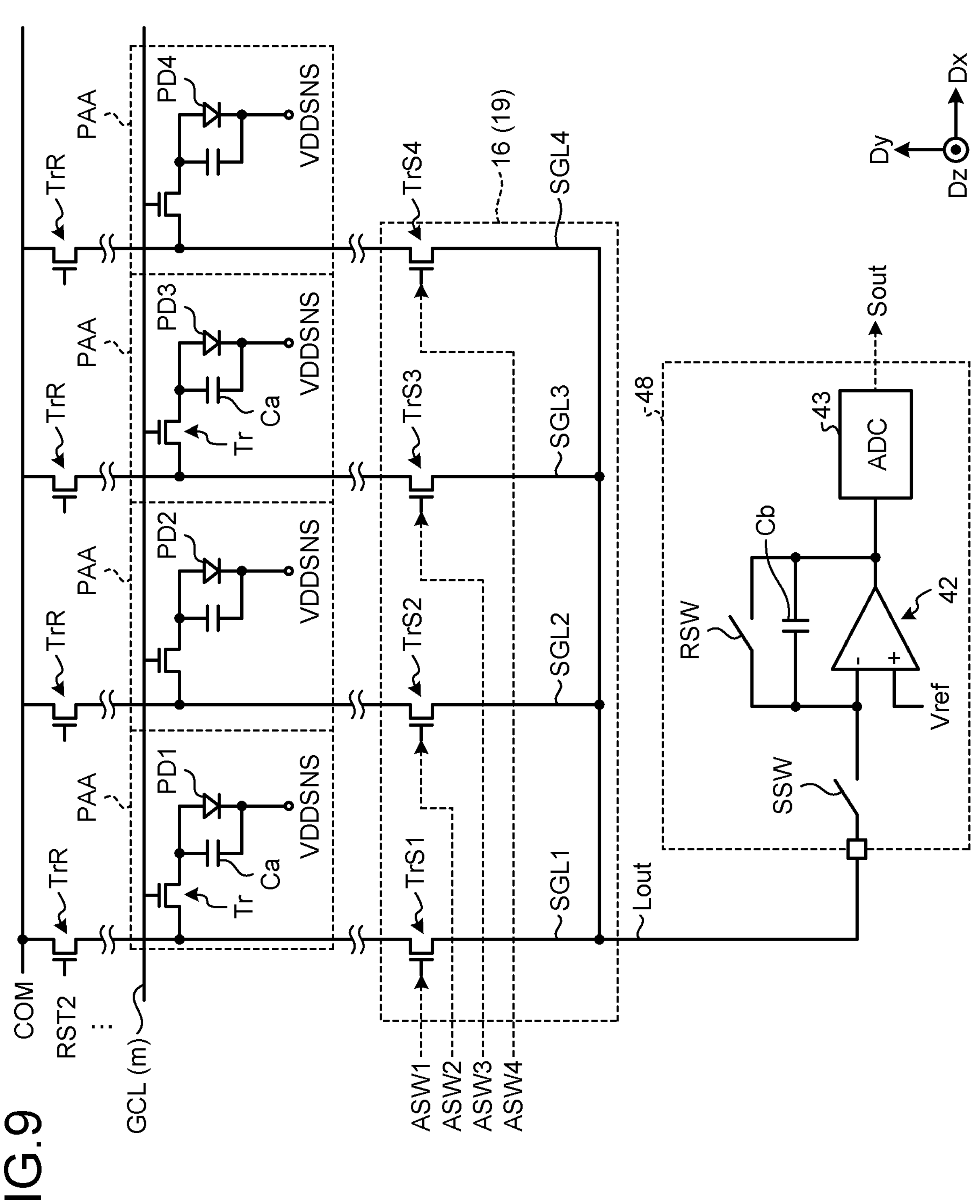
FIG. 9 is a circuit diagram for explaining a coupling relation of the photodiodes with a detection circuit.

FIG. 9 is a circuit diagram for explaining a coupling relation of the photodiodes with the detection circuit. FIG. 9 illustrates four photodiodes PD1, PD2, PD3, and PD4 arranged in the first direction Dx. The drive transistor Tr and the capacitive element Ca described above are provided for each of the photodiodes PD1, PD2, PD3, and PD4. In the following description, the photodiodes PD1, PD2, PD3, and PD4 will each be simply referred to as the photodiode PD when they need not be distinguished from one another.

The four photodiodes PD1, PD2, PD3, and PD4 are coupled to one of the detection circuits 48 through the signal line selection circuit 16 (coupling switching circuit 19). The coupling switching circuit 19 is a circuit that switches the coupling of the photodiodes PD to one or more of the detection circuits 48. For ease of understanding of the description, FIG. 9 illustrates only one of the detection circuits 48 and does not illustrate the detection circuit selecting circuit 18 (refer to FIG. 12) provided on the detection circuit 48 side of the coupling switching circuit 19.

As illustrated in FIG. 9, the gates of the drive transistors Tr coupled to the respective photodiodes PD arranged in the first direction Dx are coupled to the gate line GCL that is common thereto. The sources of the drive transistors Tr coupled to the photodiodes PD1, PD2, PD3, and PD4 are respectively coupled to signal lines SGL1, SGL2, SGL3, and SGL4. That is, the signal lines SGL1, SGL2, SGL3, and SGL4 are respectively coupled to the photodiodes PD1, PD2, PD3, and PD4 through the drive transistors Tr. The four signal lines SGL1, SGL2, SGL3, and SGL4 are coupled to the detection circuit 48 through the output signal line Lout that is common thereto.

The configuration of the signal line selection circuit 16 is as described above with reference to FIG. 3, and will not be described again. In the example illustrated in FIG. 9, the signal line selection circuit 16 adjusts the detection sensitivity of the detection device 1 by switching the coupling of the four photodiodes PD1, PD2, PD3, and PD4 to one of the detection circuits 48. In other words, the signal line selection circuit 16 changes the number of the signal lines SGL coupled to one of the output signal lines Lout.

For example, the signal line selection circuit 16 turns on output transistors TrS1 and TrS2 and turns off output transistors TrS3 and TrS4 based on the selection signal ASW from the control circuit 122. The two photodiodes PD1 and PD2 are coupled to the output signal line Lout through the signal lines SGL1 and SGL2, respectively. The two photodiodes PD3 and PD4 are decoupled from the output signal line Lout. As a result, the two photodiodes PD1 and PD2 are simultaneously coupled to one of the detection circuits 48.

The signal line selection circuit 16 turns off the output transistors TrS1 and TrS2 and turns on the output transistors TrS3 and TrS4 in a time-division manner based on the selection signal ASW from the control circuit 122.

As a result, the two photodiodes PD3 and PD4 are simultaneously coupled to the detection circuit 48 through one of the output signal lines Lout. The two photodiodes PD1 and PD2 are decoupled from the output signal line Lout. Thus, the detection device 1 can substantially double the detection sensitivity (sensor area) by coupling the two photodiodes PD as one set of sensor elements to one of the detection circuits 48. The combination of two simultaneously selected photodiodes PD can be changed to any combination.

The signal line selection circuit 16 may handle three of the photodiodes PD as one set of sensor elements and simultaneously couple the one set of sensor elements collectively to one of the detection circuits 48. In this case, the detection device 1 can substantially triple the detection sensitivity (sensor area). Alternatively, the signal line selection circuit 16 may handle four or more of the photodiodes PD as one set of sensor elements and simultaneously couple the one set of sensor elements collectively to one of the detection circuits 48. In this case, the detection device 1 can substantially increase the detection sensitivity (sensor area) by a factor of four or more.

During the read period Pdet (refer to FIG. 6), a switch SSW of the detection circuit 48 is turned on to couple the detection circuit 48 to the signal lines SGL. The detection signal amplifying circuit 42 of the detection circuit 48 converts current supplied from the signal lines SGL into voltage corresponding to the value of the current and amplifies the result. A reference potential (Vref) having a fixed potential is supplied to a non-inverting input part (+) of the detection signal amplifying circuit 42, and the signal lines SGL are coupled to an inverting input part (−) of the detection signal amplifying circuit 42. In the present embodiment, the same signal as the reference signal COM is supplied as the reference potential (Vref) voltage. For example, the reference potential (Vref) voltage is the same voltage as that of the reference signal COM. The signal processing circuit 44 (refer to FIG. 2) calculates, as the sensor output voltage Vo, the difference between the detection signal Vdet when the photodiode PD is irradiated by light and the detection signal Vdet (baseline) when the photodiode PD is not irradiated by light. The detection signal amplifying circuit 42 includes a capacitive element Cb and a reset switch RSW. During the reset period Prst, the reset switch RSW is turned on to reset the electric charge of the capacitive element Cb.

Figure 10:
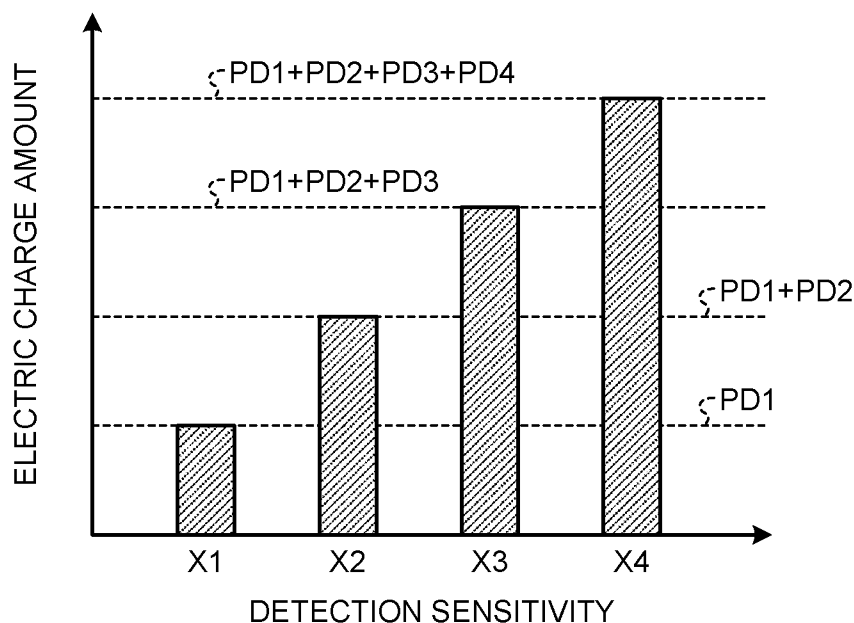
FIG. 10 is an explanatory diagram for explaining a relation between an amount of the electric charge output from the photodiodes and sensor sensitivity.

FIG. 10 is an explanatory diagram for explaining a relation between the amount of the electric charge output from the photodiodes (the electric charge amount) and the sensor sensitivity. In the graph illustrated in FIG. 10, the horizontal axis represents the detection sensitivity of the detection device 1, and the vertical axis represents the amount of the electric charge output from the photodiodes PD (the electric charge amount). The detection sensitivity represented by the horizontal axis corresponds to the number of the photodiodes PD that are collectively coupled to one of the detection circuits 48 by the signal line selection circuit 16. For example, when the two photodiodes PD1 and PD2 are coupled to one of the detection circuits 48, the detection sensitivity is expressed as doubled (×2). The electric charge amount represented by the vertical axis indicates the total amount of the electric charge output from the photodiodes PD coupled to one of the detection circuits 48.

As illustrated in FIG. 10, as the detection sensitivity of the detection device 1 is increased by the signal line selection circuit 16, that is, as the number of the photodiodes PD coupled to one of the detection circuits 48 increases, the amount of the electric charge simultaneously output from the photodiodes PD to one of the detection circuits 48 increases.

Figure 11:
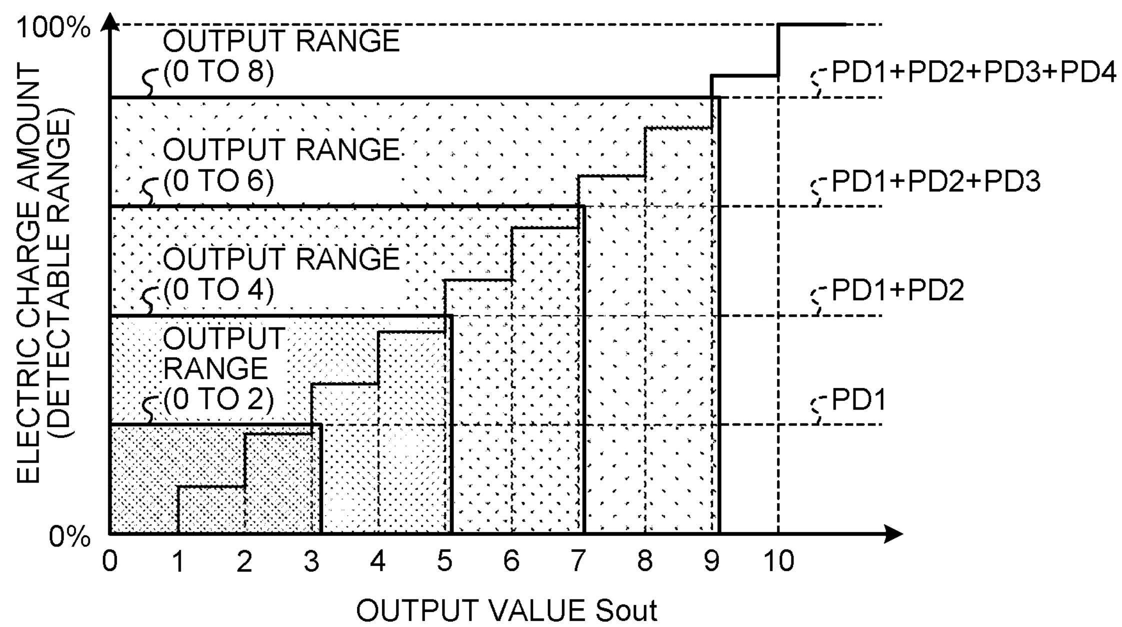
FIG. 11 is an explanatory diagram for explaining a relation between the amount of the electric charge output from the photodiodes and the output value of the detection circuit.

FIG. 11 is an explanatory diagram for explaining a relation between the amount of the electric charge output from the photodiodes (electric charge amount) and the output value of the detection circuit. In the graph illustrated in FIG. 11, the horizontal axis represents the output value Sout output from the A/D conversion circuit 43 of the detection circuit 48, and the output value Sout that is a digital output discretized into 10 steps is illustrated. The vertical axis represents both the electric charge amount described with reference to FIG. 10 and detectable ranges of the detection circuit 48.

As illustrated in FIG. 11, as the detection sensitivity of the detection device 1 is increased by the signal line selection circuit 16, that is, as the number of the photodiodes PD coupled to one of the detection circuits 48 increases, the output value of the A/D conversion circuit 43 of the detection circuit 48 is widened. For example, when the detection sensitivity corresponds to a factor of one (photodiode PD1), the output range of the A/D conversion circuit 43 includes three steps of 0, 1, and 2. In contrast, when the detection sensitivity is increased by a factor of four (photodiodes PD1, PD2, PD3, and PD4), the output value of the A/D conversion circuit 43 is widened to include nine steps of from 0 to 8. In other words, the gradation value of the output value Sout digitalized by the A/D conversion circuit 43 increases as the detection sensitivity increases.

However, if the detection sensitivity is further increased, the photodiodes PD output an electric charge the amount of which exceeds the detectable range of the detection circuit 48, thus causing a range that cannot be measured by the detection circuit 48 to occur. The detectable range (analog range) of the detection circuit 48 can be widened by increasing the capacitance of the capacitive element Cb (refer to FIG. 9) included in the detection circuit 48. However, the output range of the A/D conversion circuit 43 remains the same, having the 10 steps, so that the obtained digital gradation value remains the same. That is, the detection sensitivity of the detection device 1 is determined by the electric charge amount of the photodiode PD and the resolution of the detection circuit 48 (A/D conversion circuit 43).

Figure 12:
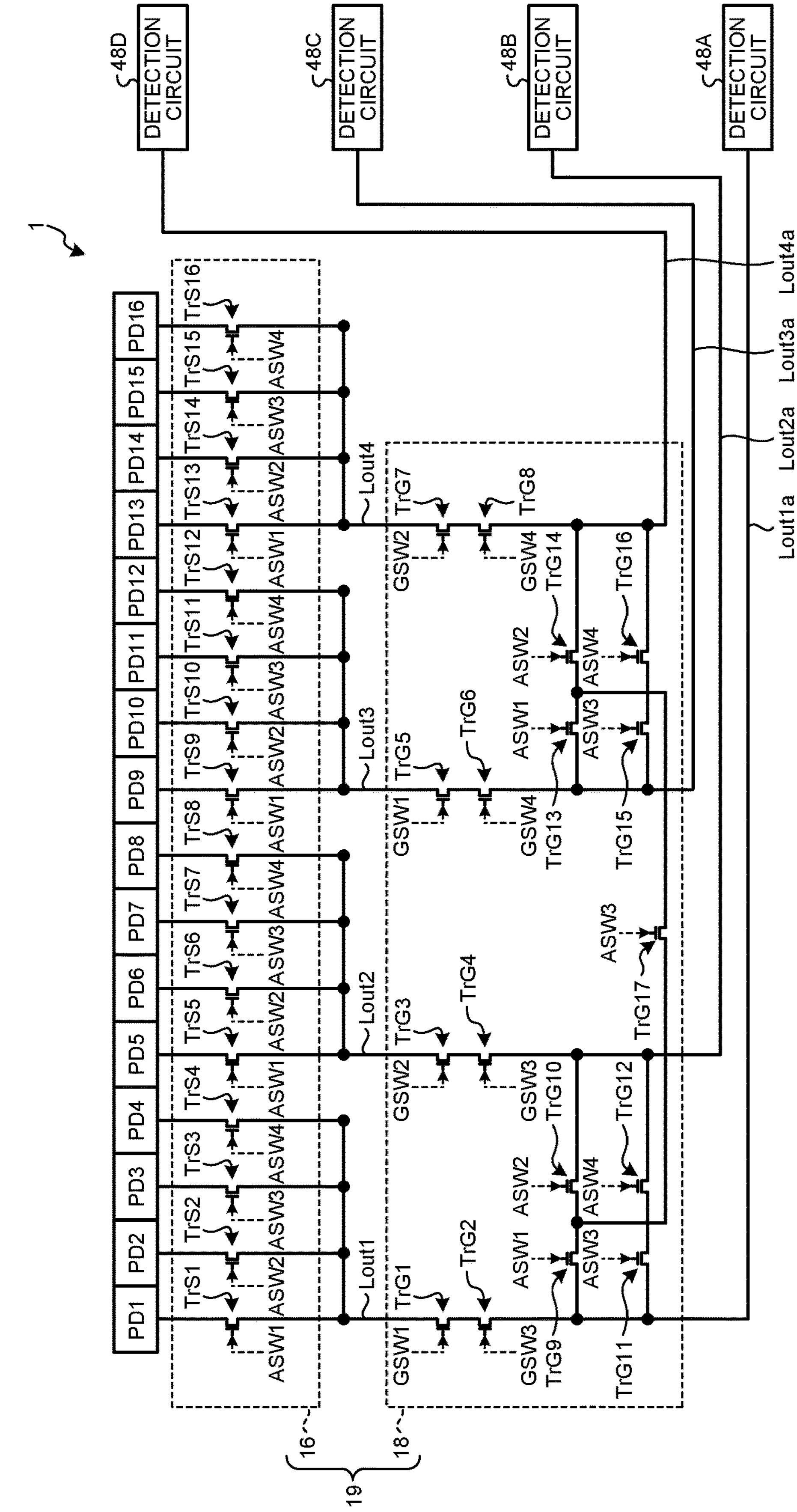
FIG. 12 is a circuit diagram illustrating a configuration example of a coupling switching circuit.

FIG. 12 is a circuit diagram illustrating a configuration example of the coupling switching circuit. FIG. 12 illustrates 16 photodiodes PD1 to PD16 arranged in the first direction Dx. As illustrated in FIG. 12, four detection circuits 48A, 48B, 48C, and 48D are provided corresponding to the 16 photodiodes PD1 to PD16. The four detection circuits 48A, 48B, 48C, and 48D have each the same configuration as that of the detection circuit 48 illustrated in FIG. 9. In the following description, for ease of understanding, the four detection circuits 48A, 48B, 48C, and 48D are assumed to have the same performance (such as the detectable range and the resolution).

The coupling switching circuit 19 is a circuit that switches the coupling between the photodiodes PD1 to PD16 and the four detection circuits 48A, 48B, 48C, and 48D. More specifically, the coupling switching circuit 19 includes the signal line selection circuit 16 and the detection circuit selecting circuit 18.

The signal line selection circuit 16 is a circuit that changes the number of the signal lines SGL (photodiodes PD) coupled to one of the output signal lines Lout as described above. In FIG. 12, one output signal line Lout is provided for each unit of four photodiodes PD. For example, the signal line selection circuit 16 changes the number of the photodiodes PD1, PD2, PD3, and PD4 coupled to one output signal line Lout1. In the same manner, the signal line selection circuit 16 changes the number of the photodiodes PD5, PD6, PD7, and PD8 coupled to one output signal line Lout2. The signal line selection circuit 16 changes the number of the photodiodes PD9, PD10, PD11, and PD12 coupled to one output signal line Lout3. The signal line selection circuit 16 changes the number of the photodiodes PD13, PD14, PD15, and PD16 coupled to one output signal line Lout4.

The detection circuit selecting circuit 18 is a circuit that changes the number of the detection circuits 48 coupled to one output signal line Lout. Specifically, when the signal line selection circuit 16 handles more than one of the photodiodes PD as one set of sensor elements and couples the one set of sensor elements collectively to one of the output signal lines Lout, the detection circuit selecting circuit 18 handles more than one of the detection circuits 48 as one set of detection circuits and couples the one set of detection circuits collectively to the one of the output signal lines Lout. By this operation, the coupling switching circuit 19 couples one or more of the photodiodes PD to one or more of the detection circuits 48.

The detection circuit selecting circuit 18 is a switch circuit including a plurality of switches TrG1 to TrG17. The switches TrG1 to TrG8 switch the coupling of the output signal lines Lout on the photodiode PD side to the output signal lines Lout on the detection circuit 48 side. In other words, the switches TrG1 to TrG8 switch the coupling between the photodiodes PD coupled to the output signal lines Lout by the signal line selection circuit 16 and the detection circuits 48. The switches TrG9 to TrG17 switch the coupling of the output signal lines Lout on the detection circuit 48 side. In other words, the switches TrG9 to TrG17 change the number of the detection circuits 48 coupled to one of the output signal lines Lout on the photodiode PD side.

The switches TrG1 and TrG2 are coupled in series between the output signal line Lout1 on the photodiode PD side and an output signal line Lout1*a* on the detection circuit 48A side. The switches TrG3 and TrG4 are coupled in series between the output signal line Lout2 on the photodiode PD side and an output signal line Lout2*a* on the detection circuit 48B side. The switches TrG5 and TrG6 are coupled in series between the output signal line Lout3 on the photodiode PD side and an output signal line Lout3*a* on the detection circuit 48C side. The switches TrG7 and TrG8 are coupled in series between the output signal line Lout4 on the photodiode PD side and an output signal line Lout4*a* on the detection circuit 48D side.

The switches TrG9 and TrG10 are coupled in series between the output signal line Lout1*a* on the detection circuit 48A side and the output signal line Lout2*a* on the detection circuit 48B side. The switches TrG11 and TrG12 are coupled in series to each other between the output signal line Lout1*a* on the detection circuit 48A side and the output signal line Lout2*a* on the detection circuit 48B side and in parallel with the switches TrG9 and TrG10.

The switches TrG13 and TrG14 are coupled in series between the output signal line Lout3*a* on the detection circuit 48C side and the output signal line Lout4*a* on the detection circuit 48D side. The switches TrG15 and TrG16 are coupled in series to each other between the output signal line Lout3*a* on the detection circuit 48C side and the output signal line Lout4*a* on the detection circuit 48D side and in parallel with the switches TrG13 and TrG14.

One end of the switch TrG17 is coupled between the switches TrG9 and TrG10, and the other end thereof is coupled between the switches TrG13 and TrG14.

The switches TrG1 to TrG8 are controlled to be on and off based on selection signals GSW1 to GSW4 from the control circuit 122. The switches TrG9 to TrG17 are controlled to be on and off based on the selection signals ASW1 to ASW4 from the control circuit 122. That is, the switches TrG9 to TrG17 are controlled to be on and off in synchronization with the output transistors TrS of the signal line selection circuit 16.

Figure 13:
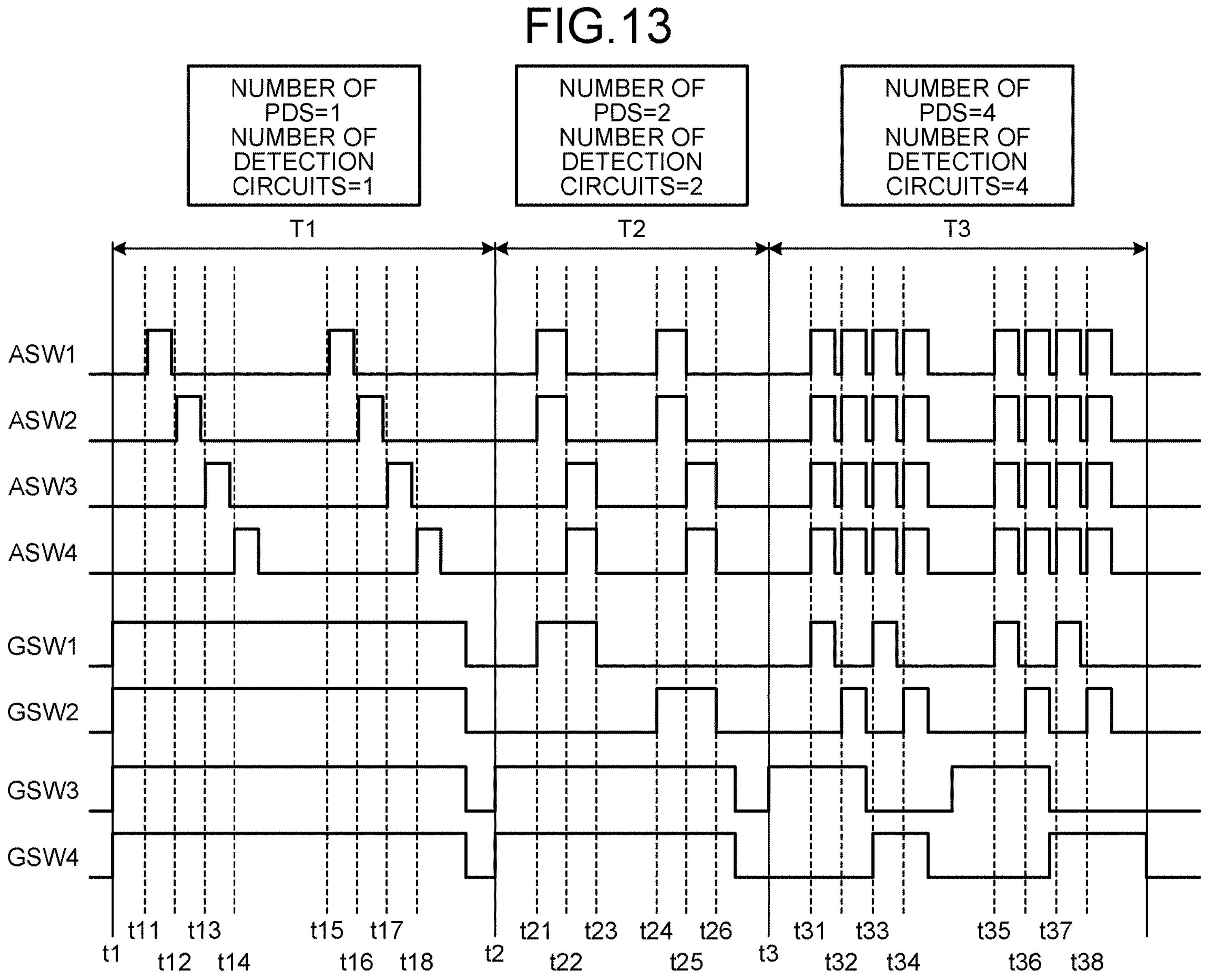
FIG. 13 is a timing waveform diagram illustrating an operation example of the coupling switching circuit.

FIG. 13 is a timing waveform diagram illustrating an operation example of the coupling switching circuit. As illustrated in FIG. 13, the detection device 1 changes, for each of first, second and third periods T1, T2 and T3, the number of the photodiodes PD to be handled as one set and the number of the detection circuits 48 to be handled as one set. In the first period T1, the coupling switching circuit 19 operates to couple one of the photodiodes PD to one of the detection circuits 48 through one of the output signal lines Lout. In the second period T2, the coupling switching circuit 19 operates to handle two of the photodiode PD as one set of sensor elements and couple the one set of sensor elements collectively to two of the detection circuits 48 through one of the output signal lines Lout. In the third period T3, the coupling switching circuit 19 operates to handle four of the photodiode PD as one set of sensor elements and couple the one set of sensor elements collectively to the four detection circuits 48 through one of the output signal lines Lout.

Specifically, in the first period T1, the selection signals GSW1, GSW2, GSW3, and GSW4 are set to HIGH (high-level voltage) at time t1. That is, the switches TrG1 to TrG8 included in the detection circuit selecting circuit 18 are caused to be on (in a conduction state) over the first period T1 based on the selection signals GSW from the control circuit 122.

The selection signals ASW1, ASW2, ASW3, and ASW4 are sequentially set to HIGH (high-level voltage) in a time-division manner at times t11, t12, t13, and t14. That is, at least one of the switches TrG9 to switch TrG17 included in the detection circuit selecting circuit 18 is turned off (in a non-conduction state) between the output signal lines Lout. In other words, the output signal lines Lout1*a*, Lout2*a*, Lout3*a*, and Lout4*a* on the detection circuit 48 side are individually coupled to the output signal lines Lout1, Lout2, Lout3, and Lout4, respectively, on the photodiode PD side. This operation sequentially couples one of the photodiodes PD to one of the detection circuits 48 through one of the output signal lines Lout.

For example, at time t11, the output transistor TrS1 coupled to the photodiode PD1 is turned on, and the switches TrG1 and TrG2 coupled to the output signal line Lout1 are turned on. The switches TrG10, TrG11, TrG12, TrG14, TrG15, TrG16, and TrG17 that couple the output signal line Lout1 to the other output signal lines Lout are turned off. As a result, the photodiode PD1 is coupled to the detection circuit 48A through the output signal line Lout1. In the same manner, at time t11, the photodiode PD5 is coupled to the detection circuit 48B through the output signal line Lout2. The photodiode PD9 is coupled to the detection circuit 48C through the output signal line Lout3. The photodiode PD13 is coupled to the detection circuit 48D through the output signal line Lout4.

From time t12 to time t14, the photodiodes PD2 to PD4 are sequentially selected and coupled to the detection circuit 48A through the output signal line Lout1. In the same manner, the photodiodes PD6 to PD8 are sequentially selected and coupled to the detection circuit 48B through the output signal line Lout2. The photodiodes PD10 to PD12 are sequentially selected and coupled to the detection circuit 48C through the output signal line Lout3. The photodiodes PD14 to PD16 are sequentially selected and coupled to the detection circuit 48D through the output signal line Lout4. Subsequently, from time t15 to time t18, the same operations as those from time t1*l* to time t14 are repeated.

Then, at time t2 in the second period T2, the selection signals GSW3 and GSW4 are set to HIGH (high-level voltage), and the selection signals GSW1 and GSW2 are set to LOW (low-level voltage). That is, the switches TrG2, TrG4, TrG6, and TrG8 included in the detection circuit selecting circuit 18 are turned on (in the conduction state) over the second period T2 based on the selection signals GSW3 and GSW4 from the control circuit 122. The switches TrG1, TrG3, TrG5, and TrG7 are turned off at time t2 based on the selection signals GSW1 and GSW2 from the control circuit 122.

At time t21, the selection signals ASW1 and ASW2 are simultaneously set to HIGH (high-level voltage). At time t21, the selection signals ASW3 and ASW4 are set to LOW (low-level voltage). That is, the switches TrG9, TrG10, TrG13, and TrG14 included in the detection circuit selecting circuit 18 are turned on based on the selection signals ASW1 and ASW2 from the control circuit 122, and the switches TrG11, TrG12, TrG15, TrG16, and TrG17 are turned off based on the selection signals ASW3 and ASW4 from the control circuit 122. At time t21, the selection signal GSW1 is set to HIGH (high-level voltage). As a result, the switches TrG1 and TrG5 are turned on at time t21 based on the selection signal GSW1 from the control circuit 122. The switches TrG3 and TrG7 remain to be off based on the selection signal GSW2 from the control circuit 122.

As a result, at time t21, the two detection circuits 48A and 48B are coupled in parallel to the one output signal line Lout1 through the output signal lines Lout1*a* and Lout2*a*. The two detection circuits 48C and 48D are coupled in parallel to the one output signal line Lout3 through the output signal lines Lout3*a* and Lout4*a*. The output signal lines Lout2 and Lout4 are decoupled from the detection circuit 48 because the switches TrG3 and TrG7 are off.

At time t21, the output transistors TrS1 and TrS2 coupled to the photodiodes PD1 and PD2 are turned on based on the selection signals ASW1 and ASW2 from the control circuit 122. The output transistors TrS3 and TrS4 coupled to the photodiodes PD3 and PD4 are turned off based on the selection signals ASW3 and ASW4 from the control circuit 122.

As a result, the two photodiodes PD1 and PD2 are handled as one set and coupled collectively to the two detection circuits 48A and 48B through the one output signal line Lout1. In the same manner, the two photodiodes PD9 and PD10 are handled as one set and coupled collectively to the two detection circuits 48C and 48D through the one output signal line Lout3.

At time t21, the output transistors TrS5 and TrS6 coupled to the photodiodes PD5 and PD6 are turned on based on selection signals ASW1 and ASW2 from the control circuit 122. The output transistors TrS13 and TrS14 coupled to the photodiodes PD13 and PD14 are turned on based on the selection signals ASW1 and ASW2 from the control circuit 122. However, since the switches TrG3 and TrG7 are off as described above, the photodiodes PD5, PD6, PD13, and PD14 are decoupled from the detection circuit 48.

Then, at time t22, the selection signals ASW1 and ASW2 are set to LOW (low-level voltage), and the selection signals ASW3 and ASW4 are set to HIGH (high-level voltage). The selection signals GSW1, GSW2, GSW3, and GSW4 maintain the same state as that at time t21.

As a result, the two photodiodes PD3 and PD4 are handled as one set and coupled collectively to the two detection circuits 48A and 48B through the one output signal line Lout1. In the same manner, the two photodiodes PD11 and PD12 are handled as one set and coupled collectively to the two detection circuits 48C and 48D through the one output signal line Lout3.

At time t24, the selection signal GSW1 is set to LOW (low-level voltage), and the selection signal GSW2 is set to HIGH (high-level voltage). As a result, the switches TrG1 and TrG5 are turned off based on the selection signal GSW1 from the control circuit 122, and the switches TrG3 and TrG7 are turned on based on the selection signal GSW2 from the control circuit 122. From time t24 to time t26, the same selection signals ASW1, ASW2, ASW3, and ASW4 as those from time t21 to time t23 are supplied.

As a result, at time t24, the two detection circuits 48A and 48B are coupled in parallel to the one output signal line Lout2 through the output signal lines Lout1*a* and Lout2*a*. The two detection circuits 48C and 48D are coupled in parallel to the one output signal line Lout4 through the output signal lines Lout3*a* and Lout4*a*. The output signal lines Lout1 and Lout3 are decoupled from the detection circuit 48 because the switches TrG1 and TrG5 are off.

At time t24, the two photodiodes PD5 and PD6 are handled as one set and coupled collectively to the two detection circuits 48A and 48B through the one output signal line Lout2. In the same manner, the two photodiodes PD13 and PD14 are handled as one set and coupled collectively to the two detection circuits 48C and 48D through the one output signal line Lout4. At time t24, since the switches TrG3 and TrG7 are off as described above, the photodiodes PD1, PD2, PD9, and PD10 are decoupled from the detection circuit 48.

At time t25, the two photodiodes PD7 and PD8 are handled as one set and coupled collectively to the two detection circuits 48A and 48B through the one output signal line Lout2. In the same manner, the two photodiodes PD15 and PD16 are handled as one set and coupled collectively to the two detection circuits 48C and 48D through the one output signal line Lout4. At time t25, since the switches TrG3 and TrG7 are off as described above, the photodiodes PD3, PD4, PD11, and PD12 are decoupled from the detection circuit 48.

Then, in the third period T3, the combination of the selection signals GSW at HIGH (high-level voltage) and the selection signals GSW at LOW (low-level voltage) is different among periods from time t31 to time t34. Specifically, at time t31, the selection signals GSW1 and GSW3 are set to HIGH (high-level voltage), and the selection signals GSW2 and GSW4 are set to LOW (low-level voltage). This combination couples the one output signal line Lout1 to the detection circuit 48, and decouples the other output signal lines Lout2, Lout3, and Lout4 from the detection circuit 48. In the same manner, at each of times t32, t33, and t34, the output signal lines Lout2, Lout3, and Lout4 are sequentially coupled to the detection circuit 48 one by one, while the output signal lines Lout other than the coupled one are decoupled from the detection circuit 48.

In each of the periods from time t31 to time t34, the selection signals ASW1, ASW2, ASW3, and ASW4 are all set to HIGH (high-level voltage). That is, the switches TrG9 to TrG17 included in the detection circuit selecting circuit 18 are turned on based on the selection signals ASW1, ASW2, ASW3, and ASW4 from the control circuit 122.

As a result, at time t31, the four detection circuits 48A, 48B, 48C and 48D are coupled in parallel to the one output signal line Lout1 through the output signal lines Lout1*a*, Lout2*a*, Lout3*a*, and Lout4*a*. The output signal lines Lout2, Lout3, and Lout4 are decoupled from the detection circuits 48 as described above.

From time t31 to time t34, the selection signals ASW1, ASW2, ASW3, and ASW4 are all set to HIGH (high-level voltage). As a result, all the output transistors TrS1 to TrS16 coupled to the photodiodes PD1 to PD16 are turned on based on the selection signals ASW from the control circuit 122.

Consequently, at time t31, the four photodiodes PD1, PD2, PD3, and PD4 are handled as one set and coupled collectively to the four detection circuits 48A, 48B, 48C, and 48D through the one output signal line Lout1. In the same manner, at time t32, the four photodiodes PD5, PD6, PD7, and PD8 are handled as one set and coupled collectively to the four detection circuits 48A, 48B, 48C, and 48D through the one output signal line Lout2. At time t33, the four photodiodes PD9, PD10, PD11, and PD12 are handled as one set and coupled collectively to the four detection circuits 48A, 48B, 48C, and 48D through the one output signal line Lout3. At time t34, the four photodiodes PD13, PD14, PD15, and PD16 are handled as one set and coupled collectively to the four detection circuits 48A, 48B, 48C, and 48D through the one output signal line Lout4. Subsequently, from time t35 to time t38, the same operations as those from time t31 to time t34 are repeated.

As described above, the coupling switching circuit 19 can switch the coupling state of one or more of the photodiodes PD to one or more of the detection circuits 48. As a result, the detection device 1 can improve the detection sensitivity by collectively handling the photodiodes PD as one set of sensor elements. Even when the amount of the electric charge from the photodiodes PD exceeds the detectable range of one of the detection circuits 48, it is possible for the detection device 1, by coupling the detection circuits 48 in parallel as one set of detection circuits, to enlarge the detectable range of the detection circuits 48 while maintaining the resolution of the output value Sout.

The circuit and the operational example illustrated in FIGS. 12 and 13 are merely exemplary and can be changed as appropriate. For example, the number of the photodiodes PD coupled to one of the output signal lines Lout is not limited to four, but may be two, three, or five or more. One of the output signal lines Lout may be coupled to two, three, or five or more of the detection circuits 48. FIG. 13 illustrates the first period T1, the second period T2, and the third period T3 in this order for explanation, but the order is not limited thereto. The detection device 1 can select and perform any of the operations of the first period T1, the second period T2, and the third period T3 as appropriate so as to appropriately adjust the detection sensitivity based on the output values Sout from the detection circuits 48.

Figure 14:
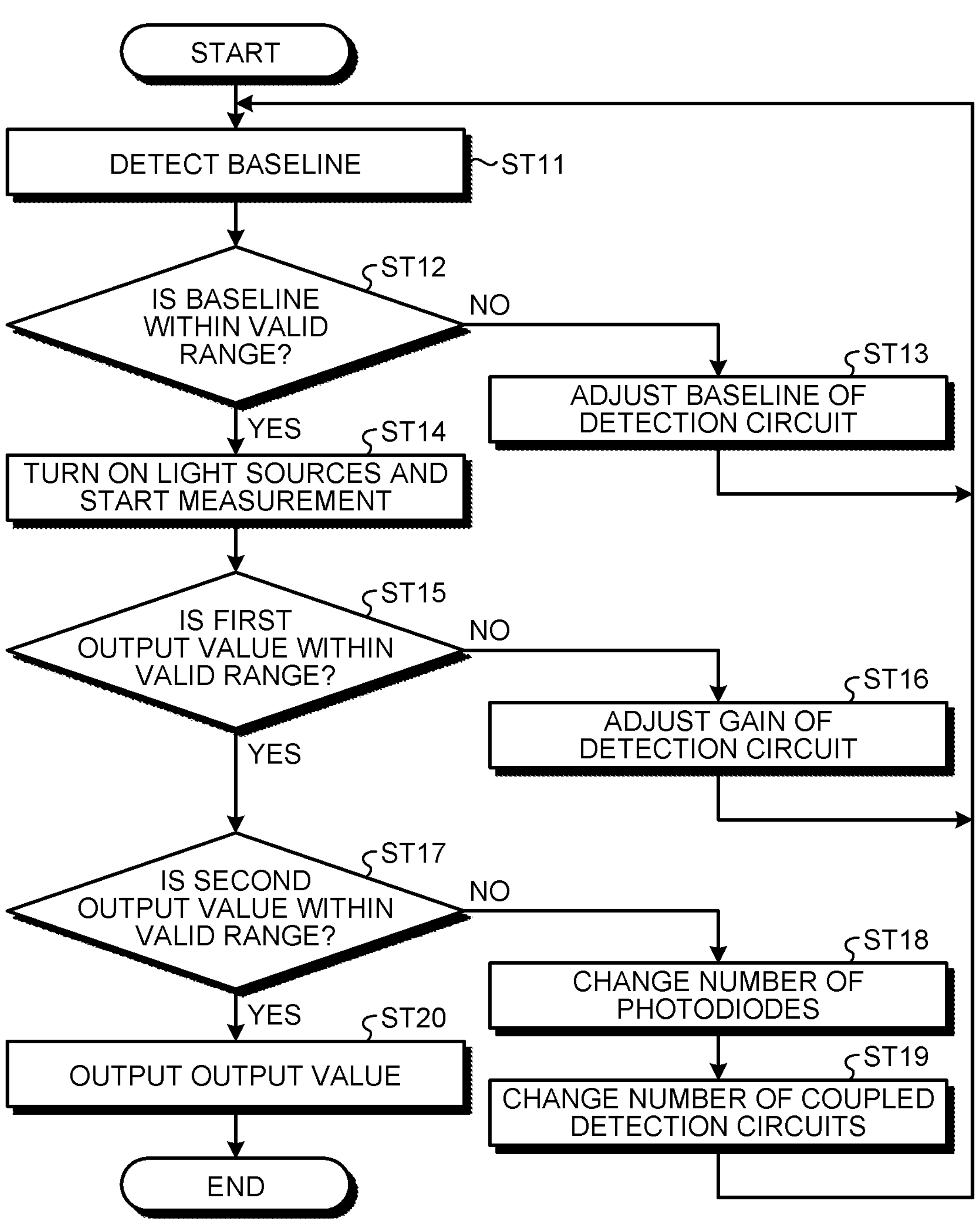
FIG. 14 is a flowchart for explaining a detection method of the detection device according to the first embodiment.
Figure 15:
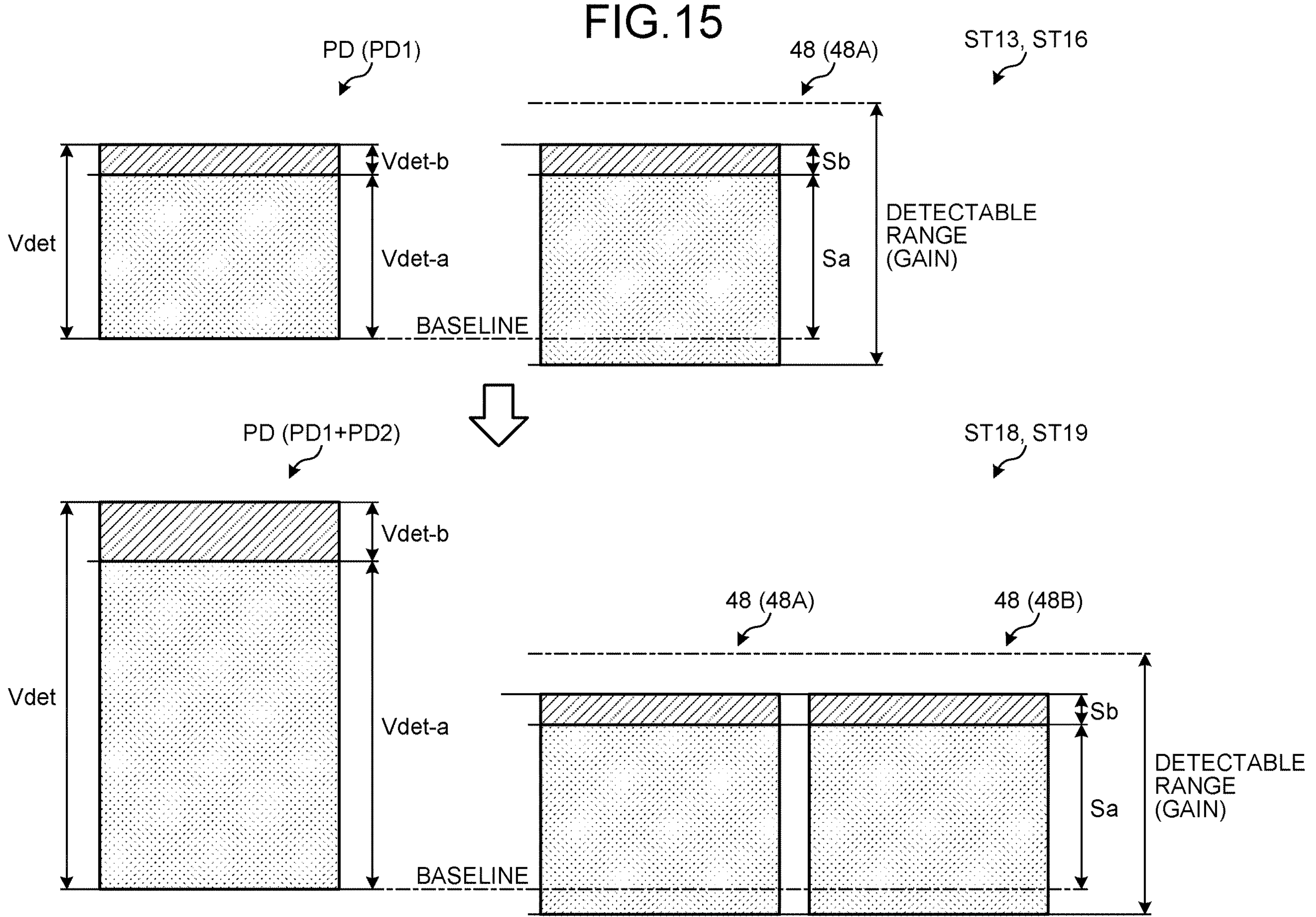
FIG. 15 is an explanatory diagram for explaining the detection method of the detection device illustrated in FIG. 14.

FIG. 14 is a flowchart for explaining a detection method of the detection device according to the first embodiment. FIG. 15 is an explanatory diagram for explaining the detection method of the detection device illustrated in FIG. 14. As illustrated in FIG. 14, the control circuit 122 turns off the light sources 53 and 54 and detects the baseline by causing the photodiodes PD to perform the detection in the detection area AA (Step ST11).

The signal processing circuit 44 (refer to FIG. 2) of the detector 40 compares a measured value of the baseline with a preset reference value to determine whether the baseline is within a valid range (Step ST12). The valid range of the baseline is set to a range within which a sufficient measurement range can be ensured when light is emitted from light sources 53 and 54. The reference value of the baseline is stored in the storage circuit 46 (refer to FIG. 2) of the detector 40. However, the reference value of the baseline is not limited to being stored there, but may be stored in another storage circuit such as a storage circuit in the control circuit 122.

If the baseline is outside the valid range (No at Step ST12), the control circuit 122 adjusts the baseline set value of each of the detection circuits 48 based on the measured value of the baseline (Step ST13). As illustrated in the upper figure of FIG. 15, at Step ST13, the baseline of the detection circuit 48 is adjusted to a value in a range of 10% to 20% from the lower limit value of the detectable range, based on a detection amount (detection signal Vdet) from one of the photodiodes PD. With this adjustment, even if the detection amount from the photodiode PD changes, the detection circuit 48 allows for a large amount of the change. The detection device 1 then measures the baseline again.

Referring back to FIG. 14, if the baseline is within the valid range (Yes at Step ST12), the control circuit 122 turns on the light sources 53 and 54, and causes the photodiodes PD to start the detection (Step ST14).

The signal processing circuit 44 receives the output value Sout from the detection circuit 48, calculates the first output value Sa and the second output value Sb, and determines whether the first output value Sa is within the valid range (Step ST15). The valid range of the first output value Sa is set within a valid range in the detectable range of the detection circuit 48. As described above, the first output value Sa is the detection value (DC component) indicating, for example, the light L1 from the light sources 53 and 54 transmitted through the object Fg to be detected.

If the first output value Sa is outside the valid range (No at Step ST15), the control circuit 122 adjusts the gain of the detection circuit 48, in more detail, the analog gain of the detection signal amplifying circuit 42, based on the measured output value Sout (Step ST16). Here, the gain of the detection circuit 48 is adjusted so that the first output value Sa falls within approximately 70% to 80% of the upper limit value of the detectable range, as illustrated in the upper figure of FIG. 15. The detection device 1 then measures the baseline again.

As illustrated in FIG. 14, if the first output value Sa is within the valid range (Yes at Step ST15), the signal processing circuit 44 determines whether the second output value Sb of the output value Sout from the detection circuit 48 is within the valid range (Step ST17). As described above, the second output value Sb is the detection value (AC component) indicating, for example, changes in the pulse waves of the object Fg to be detected.

If the second output value Sb is outside the valid range (No at Step ST17), the control circuit 122 changes the number of the photodiodes PD coupled collectively to one of the output signal lines Lout, based on the measured second output value Sb (Step ST18). For example, if the detected second output value Sb is below the valid range, the control circuit 122 switches the coupling of the photodiodes PD by supplying the selection signals ASW and GSW to the coupling switching circuit 19 to increase the number of the photodiodes PD.

When the two photodiodes PD1 and PD2 are coupled collectively to one of the output signal lines Lout, the detection amount (detection signal Vdet) from the two photodiodes PD1 and PD2 is effectively doubled as illustrated in the lower figure of FIG. 15. In this case, the detection amount may exceed the upper limit of the detectable range of one of the detection circuits 48.

As illustrated in FIG. 14, the control circuit 122 changes the number of the detection circuits 48 coupled collectively to one of the output signal lines Lout according to the number of the photodiodes PD changed at Step ST18 (Step ST19). For example, when the second output value Sb exceeds the valid range due to the increase in the number of the photodiodes PD, the control circuit 122 switches the coupling of the detection circuits 48 by supplying the selection signals ASW and GSW to the coupling switching circuit 19 to increase the number of the detection circuits 48. As illustrated in the lower figure of FIG. 15, the detection amount (detection signal Vdet) from the two photodiodes PD1 and PD2 is divided into two substantially equal halves for the two detection circuits 48A and 48B, which perform the signal processing in parallel with each other. The detection device 1 then measures the baseline again.

As illustrated in FIG. 14, if the second output value Sb is within the valid range (Yes at Step ST17), the detector 40 outputs the output value Sout (Step ST20).

In the way described above, the coupling switching circuit 19 of the detection device 1 can change the number of the photodiodes PD coupled collectively to one of the output signal lines Lout and the number of the detection circuits 48 coupled collectively to one of the output signal lines Lout, based on the output values Sout from the photodiodes PD. As a result, the detection device 1 can appropriately adjust the sensor sensitivity of the photodiodes PD and the sensitivity of the detection circuits 48 on the system side.

The detection method illustrated in FIGS. 14 and 15 is only exemplary and can be changed as appropriate. For example, the measurement and the adjustment of the baseline may be performed at a predetermined time, such as at power-on.

Second Embodiment

Figure 16:
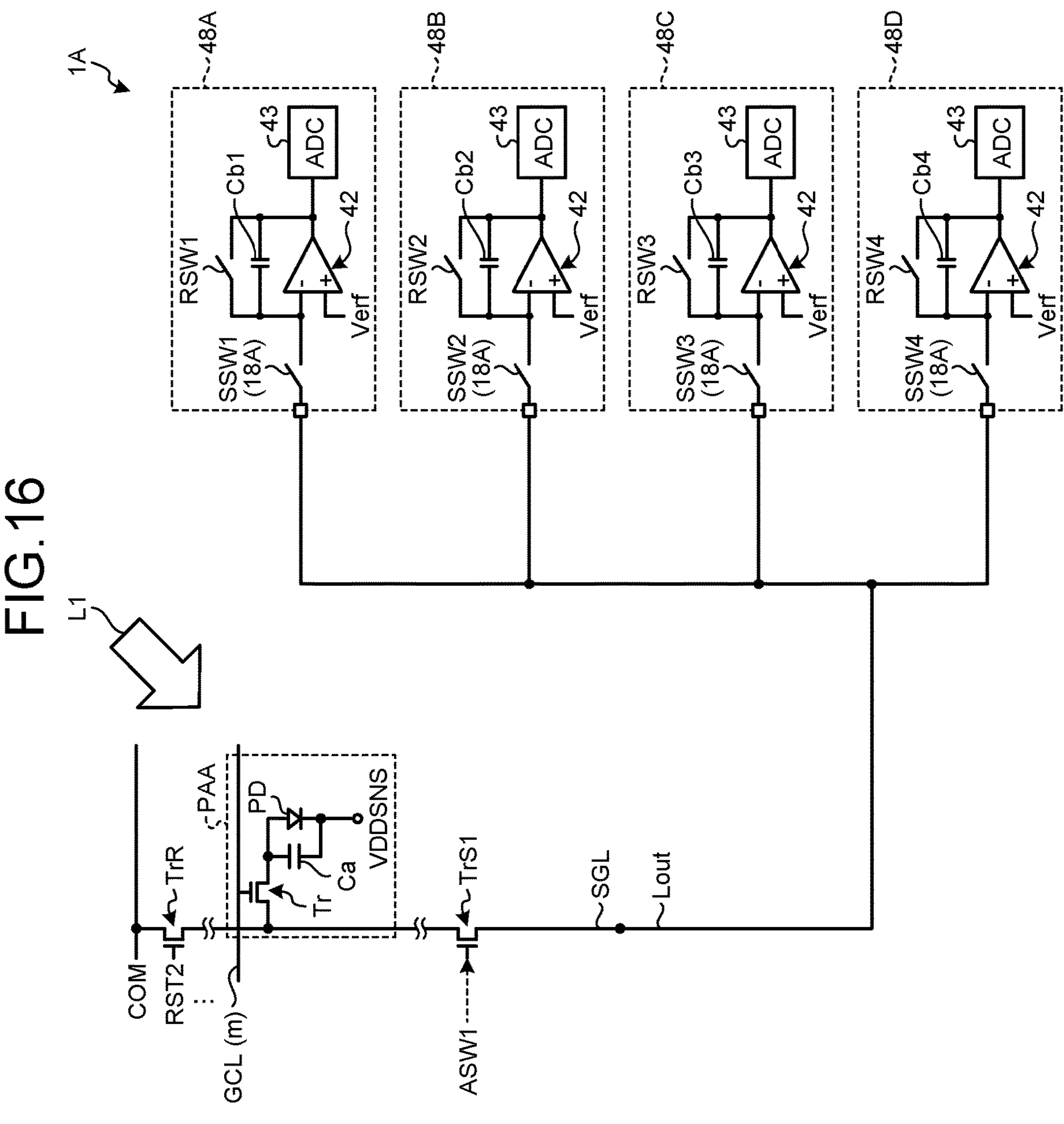
FIG. 16 is a circuit diagram illustrating a detection device according to a second embodiment.

FIG. 16 is a circuit diagram illustrating a detection device according to a second embodiment. As illustrated in FIG. 16, in a detection device 1A according to the second embodiment, each of the light sources 53 and 54 changes the emission intensity of the light L1 based on the output value Sout from the photodiode PD. Alternatively, each of the light sources 53 and 54 changes the irradiation time of the light L1 based on the output value Sout from the photodiode PD. The light sources 53 and 54 are controlled to change the emission intensity and the irradiation time of the light L1 based on control signals supplied from the control circuit 122. The amount of electric charge output from the photodiode PD changes according to the emission intensity and the irradiation time of the light L1. Thus, the detection device 1A can improve the detection sensitivity of the photodiode PD.

A detection circuit selecting circuit 18A changes the number of the detection circuits 48 coupled to one of the output signal lines Lout based on the emission intensity of the light L1 or the irradiation time of the light L1. In the present embodiment, the detection circuit selecting circuit 18A includes the switches SSW included in the detection circuits 48. Specifically, the control circuit 122 switches the coupling of the detection circuits 48A, 48B, 48C, and 48D to one of the photodiodes PD (one of the output signal lines Lout) by supplying the control signals to switches SSW1, SSW2, SSW3, and SSW4 of the detection circuits 48A, 48B, 48C, and 48D. By this operation, the detectable range can be adjusted based on the output values Sout from the photodiodes PD, using the detection circuits 48.

The second embodiment can be combined with the first embodiment described above. That is, while FIG. 16 illustrates one photodiode PD, one output signal line Lout and the four detection circuits 48, the second embodiment is not limited to this configuration. For example, more than one of the photodiodes PD may be coupled collectively to one output signal line Lout, and the emission intensity of the light L1 or the irradiation time of the light L1 may be changed. One output signal line Lout may be coupled to two, three, or five or more of the detection circuits 48. The detection circuit selecting circuit 18A is not limited to being provided with the switches SSW included in the detection circuits 48, but instead, the same coupling switching circuit 19 as that in the first embodiment described above may be provided.

Figure 17:
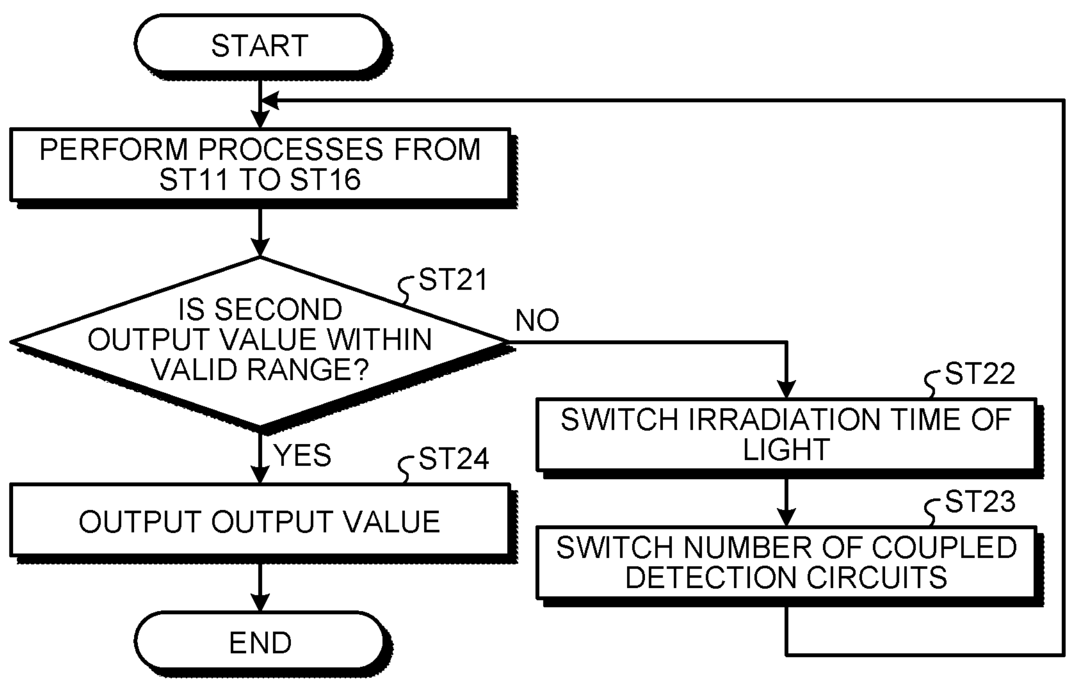
FIG. 17 is a flowchart for explaining a detection method of the detection device according to the second embodiment.

FIG. 17 is a flowchart for explaining a detection method of the detection device according to the second embodiment. As illustrated in FIG. 17, in the same manner as in the first embodiment described above, the detection device 1A performs the processes at Steps from ST11 to ST16 illustrated in FIG. 14 to detect and adjust the baseline and cause the photodiodes PD to perform the detection by turning on the light sources 53 and 54.

The signal processing circuit 44 of the detection device 1A determines whether the second output value Sb of the output value Sout from the detection circuit 48 is within the valid range (Step ST21). If the second output value Sb is outside the valid range (No at Step ST21), the control circuit 122 supplies the control signals to the light sources 53 and 54 based on the measured second output value Sb to change the irradiation time of the light L1 (Step ST22). The control circuit 122 controls the light sources 53 and 54, for example, to increase the irradiation time of the light L1 if the detected second output value Sb is below the valid range. Alternatively, the control circuit 122 may change the emission intensity of the light L1 instead of the irradiation time of the light L1. The control circuit 122 may also change both the irradiation time and the emission intensity of the light L1.

Then, the control circuit 122 changes the number of the detection circuits 48 coupled collectively to one of the output signal lines Lout based on the irradiation time of the light L1 changed at Step ST22 (Step ST23). For example, when the second output value Sb exceeds the valid range due to the increase in the irradiation time of the light L1, the control circuit 122 switches the coupling of the detection circuits 48 by supplying the control signals to the switches SSW of the detection circuits 48 so as to increase the number of detection circuits 48. The detection device 1A then measures the baseline (Step ST11) again.

If the second output value Sb is within the valid range (Yes at Step ST21), the detector 40 outputs the output value Sout (Step ST24).

In the way described above, the detection device 1A according to the second embodiment can change the irradiation time of the light L1 (or the emission intensity of the light L1) and the number of the detection circuits 48 coupled collectively to one of the output signal lines Lout by supplying the control signals to the light sources 53 and 54 based on the output values Sout from the photodiodes PD. As a result, the detection device 1A can appropriately adjust the sensor sensitivity of the photodiodes PD and the sensitivity of the detection circuits 48 on the system side.

Third Embodiment

Figure 18:
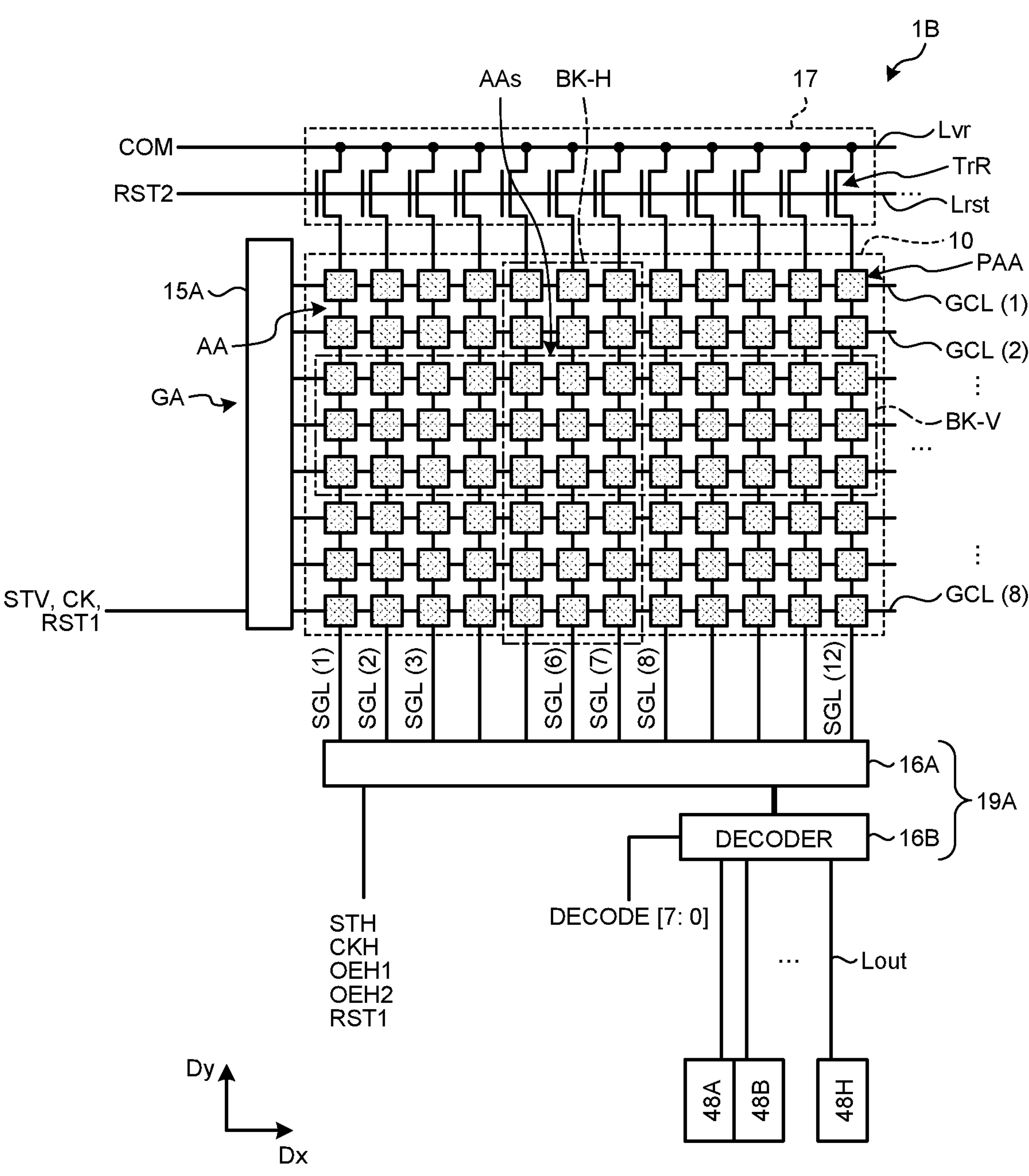
FIG. 18 is a circuit diagram illustrating a detection device according to a third embodiment.

FIG. 18 is a circuit diagram illustrating a detection device according to a third embodiment. As illustrated in FIG. 18, a detection device 1B according to the third embodiment selects a partial area of the detection area AA as a selected area AAs based on the output values Sout from the photodiodes PD, and a coupling switching circuit 19A handles the photodiodes PD in the selected area AAs as one set of sensor elements and couples the one set of sensor elements to one or more of the detection circuits 48.

In more detail, a gate line drive circuit 15A of the present embodiment can simultaneously select the gate lines GCL included in a gate line block BK-V, in addition to having the function to sequentially scan the gate lines GCL in the detection area AA. In the same manner, a signal line selection circuit 16A can simultaneously select the signal lines SGL included in a signal line block BK-H.

The selected area AAs is, for example, an area selected to detect the biometric information in more detail. The gate line drive circuit 15A selects, as the gate line block BK-V, the gate lines GCL overlapping the selected area AAs based on various control signals from the control circuit 122. The signal line selection circuit 16A selects, as the signal line block BK-H, the signal lines SGL overlapping the selected area AAs based on the various control signals from the control circuit 122. The photodiodes PD arranged in a matrix having a row-column configuration in the selected area AAs are coupled collectively as one set of sensor elements.

A detection circuit selecting circuit 18B includes a decoder circuit, for example, and changes the number of the coupled detection circuits 48, depending on the area size of the selected area AAs, that is, the number of the photodiodes PD included in the selected area AAs.

In the present embodiment, since the gate line drive circuit 15A and the signal line selection circuit 16A can change the number of the photodiodes PD serving as one set by the selected area AAs, the sensor sensitivity of the photodiodes PD can be appropriately adjusted. In addition, the configuration of the coupling switching circuit 19A can be more simplified than that in the first embodiment described above. The selected area AAs illustrated in FIG. 18 is merely an example, and the number of the photodiodes PD and the numbers of the gate lines GCL and the signal lines SGL in the selected area AAs can be changed as appropriate.

FIG. 19 is a flowchart for explaining a detection method of the detection device according to the third embodiment. As illustrated in FIG. 19, in the same manner as in the embodiment described above, a detection device 1B performs the processes at Steps from ST11 to ST16 illustrated in FIG. 14 to detect and adjust the baseline and cause the photodiodes PD to perform the detection by turning on the light sources 53 and 54.

The signal processing circuit 44 extracts the second output value Sb (AC component) from each of the output values Sout acquired at Step ST14 (Step ST31).

The signal processing circuit 44 selects, as the selected area AAs, an area where the second output value Sb is equal to or larger than a predetermined value (Step ST32). The signal processing circuit 44 compares the second output value Sb with a preset reference value to determine whether the second output value Sb is larger or smaller than the reference value.

The control circuit 122 supplies the control signals to the gate line drive circuit 15A and the signal line selection circuit 16A to change a sensor drive area (Step ST33). That is, the gate line drive circuit 15A simultaneously selects the gate lines GCL in the gate line block BK-V based on the control signal from the control circuit 122. The signal line selection circuit 16A simultaneously selects the signal lines SGL in the signal line block BK-H based on the control signal from the control circuit 122. As a result, the selected area AAs that overlaps both the gate line block BK-V and the signal line block BK-H is driven as the sensor drive area.

The control circuit 122 supplies a control signal to the coupling switching circuit 19A to maximize the number of the detection circuits 48 coupled to the photodiodes PD in the selected area AAs (Step ST34). That is, the detectable range of the detection circuits 48 is maximized correspondingly to the photodiodes PD in the selected area AAs.

The control circuit 122 then turns off the light sources 53 and 54 and detects the baseline by causing the photodiodes PD in the selected area AAs to perform the detection (Step ST35).

The signal processing circuit 44 compares a measured value of the baseline in the selected area AAs with the preset reference value to determine whether the baseline in the selected area AAs is within the valid range (Step ST36).

If the baseline in the selected area AAs is outside the valid range (No at Step ST36), the control circuit 122 adjusts the baseline set value of each of the detection circuits 48 based on the measured value of the baseline in the selected area AAs (Step ST37). The detection device 1B then measures the baseline in the selected area AAs again.

If the baseline is within the valid range (Yes at Step ST36), the control circuit 122 turns on the light sources 53 and 54 and causes the photodiodes PD in the selected area AAs to start the detection (Step ST38).

The signal processing circuit 44 receives the output value Sout from the detection circuit 48 and determines whether the first output value Sa in the selected area AAs is within the valid range (Step ST39). The valid range of the first output value Sa is set within a valid range of the detectable ranges of the detection circuits 48.

If the first output value Sa in the selected area AAs is outside the valid range (No at Step ST39), the control circuit 122 supplies the control signals to the light sources 53 and 54 to change the irradiation time of the light L1 (Step ST40). The control circuit 122 may change the emission intensity of the light L1 instead of the irradiation time of the light L1 at Step ST40. Alternatively, the control circuit 122 may change both the irradiation time and the emission intensity of the light L1. The detection is then performed again by the photodiodes PD in the selected area AAs with the changed irradiation time of the light L1.

If the first output value Sa in the selected area AAs is within the valid range (Yes at Step ST39), the signal processing circuit 44 determines whether the second output value Sb (AC component) in the selected area AAs is within the valid range (step ST41).

If the second output value Sb in the selected area AAs is outside the valid range (No at Step ST41), the control circuit 122 supplies the control signals to the light sources 53 and 54 to change the irradiation time of the light L1 (Step ST42), in the same manner as at Step ST40 described above. At Step ST42, the control circuit 122 may change the emission intensity of the light L1 instead of the irradiation time of the light L1. Alternatively, the control circuit 122 may change both the irradiation time and the emission intensity of the light L1.

The control circuit 122 then changes the number of the detection circuits 48 coupled to the photodiodes PD in the selected area AAs based on the measured second output value Sb in the selected area AAs and the changed irradiation time of the light L1 (Step ST43). Then, the detection device 1B detects the baseline in the selected area AAs at Step ST35 again.

If the second output value Sb in the selected area AAs is within the valid range (Yes at Step ST41), the detector 40 outputs the output value Sout (Step ST44).

In the way described above, the detection device 1B can select the partial area of the detection area AA as the selected area AAs based on the output values Sout from the photodiodes PD, and detect the biometric information using the photodiodes PDs in the selected area AAs. The detection device 1B of the third embodiment can be combined with the detection devices of the first and the second embodiments described above. That is, the number of the detection circuits 48 coupled collectively as one set of detection circuits can be changed as illustrated at Step ST43, and the irradiation time of the light L1 can be changed as illustrated at Steps ST40 and ST42. As a result, the detection device 1B can appropriately adjust the sensor sensitivity of the photodiodes PD in the selected area AAs and the sensitivity of the detection circuits 48 on the system side.

While the preferred embodiments of the present invention have been described above, the present invention is not limited to the embodiments described above. The content disclosed in the embodiments is merely an example, and can be variously modified within the scope not departing from the gist of the present invention. Any modifications appropriately made within the scope not departing from the gist of the present invention also naturally belong to the technical scope of the present invention. At least one of various omissions, substitutions, and changes of the components can be made without departing from the gist of the embodiments described above.

What is claimed is:

1. A detection device comprising:

a light source configured to emit light to an object to be detected;

a plurality of photodiodes arranged in a detection area;

a plurality of signal lines coupled to the photodiodes;

a plurality of detection circuits; and a coupling switching circuit configured to switch coupling of one or more of the photodiodes to one or more of the detection circuits, the coupling switching circuit being separate from each one of the plurality of detection circuits and connecting to each detection circuit via a respective output signal line, wherein the coupling switching circuit is configured to change a number of the detection circuits coupled to one or more of the photodiodes based on an output value from one or more of the photodiodes, and the coupling switching circuit comprises:

a signal line selection circuit including a first plurality of switches and a second plurality of switches, each one of the first plurality of switches coupled to a first output signal line and a respective photodiode in a first group of photodiodes, each one of the second plurality of switches coupled to a second output signal line and a respective photodiode in a second group of photodiodes, the first output signal line being different from the second output signal line, and the first group of photodiodes being different from the second group of photodiodes, the signal line selection circuit being configured to change a number of the signal lines coupled to one output signal line; and a detection circuit selecting circuit including a plurality of switches, the plurality of switches configured to provide switching of each of the first output signal line and the second output signal line being connected with one or more detection circuits through a separate output signal line, the plurality of switches being connected to the first output signal line and the second output signal line as inputs to the detection circuit selecting circuit, the plurality of switches being connected to a third output signal line and a fourth output signal line which are respectively connected to different detection circuits, and the detection circuit selecting circuit configured to change a first number of the detection circuits coupled to the one output signal line to a second number of the detection circuits coupled to the one output signal line, where the first number and the second number are each one or more.

2. The detection device according to claim 1, wherein the signal line selection circuit comprises a switch that is provided for each of the signal lines and is configured to switch coupling between the one output signal line and one of the signal lines.

3. The detection device according to claim 1, wherein the light source is configured to change an emission intensity of light based on the output value from the photodiodes.

4. The detection device according to claim 1, wherein the light source is configured to change irradiation time of light based on the output value from the photodiodes.

5. The detection device according to claim 1, wherein a partial area of the detection area is selected as a selected area based on the output value from the photodiodes, and the coupling switching circuit is configured to couple the photodiodes in the selected area collectively to one or more of the detection circuits.

6. The detection device according to claim 1, wherein the signal line selection circuit is configured to change the number of the signal lines coupled to the one output signal line to allow the signal lines to couple to one of the detection circuits, and the detection circuit selecting circuit is configured to change the first number of the detection circuits coupled to the one output signal line to allow the detection circuits to couple to one of the signal lines.

7. The detection device according to claim 1, wherein the output value includes:

a first output value that mainly corresponds to an amount of the light emitted from the light sources and that is output as a constant value regardless of a change in a state of the object to be detected; and a second output value that is a detection value indicating an amount of a change in the light transmitted through the object to be detected caused by a change in the state of the object to be detected, when the first output value is outside a valid range, a control circuit is configured to adjust a gain of the detection circuit, when the first output value is within the valid range, a signal processing circuit determines whether the second output value of the output value from the detection circuit is within the valid range, and if the second output value is out of a range, the control circuit is configured to switch a number of the photodiodes and the number of the detection circuits that are coupled to the one output signal line.

* * * * *